(12) United States Patent
Ching et al.

(10) Patent No.: US 10,879,238 B2
(45) Date of Patent: Dec. 29, 2020

(54) NEGATIVE CAPACITANCE FINFET AND METHOD OF FABRICATING THEREOF

(71) Applicant: Taiwan Semiconductor Manufacturing Co., Ltd., Hsinchu (TW)

(72) Inventors: Kuo-Cheng Ching, Hsinchu County (TW); Kuan-Lun Cheng, Hsin-Chu (TW); Chih-Hao Wang, Hsinchu County (TW); Sai-Hooi Yeong, Hsinchu County (TW); Tzer-Min Shen, Hsinchu (TW); Chi-Hsing Hsu, New Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/380,818

(22) Filed: Apr. 10, 2019

(65) Prior Publication Data

US 2019/0237464 A1 Aug. 1, 2019

Related U.S. Application Data

(60) Provisional application No. 62/712,298, filed on Jul. 31, 2018.

(51) Int. Cl.
*H01L 27/088* (2006.01)
*H01L 29/66* (2006.01)
(Continued)

(52) U.S. Cl.
CPC .... *H01L 27/0886* (2013.01); *H01L 21/26506* (2013.01); *H01L 21/3086* (2013.01);
(Continued)

(58) Field of Classification Search
CPC .......... H01L 221/0337; H01L 21/0276; H01L 21/0332; H01L 21/32139; H01L 21/31116
See application file for complete search history.

(56) References Cited

U.S. PATENT DOCUMENTS 9,978,868 B2   5/2018  Lai et al.
10,008,568 B2  6/2018  Chen et al.
(Continued)

OTHER PUBLICATIONS

Salahuddin, Sayeef and Datta Supriyo, "Use of Negative Capacitance to Provide Voltage Amplification for Low Power Nanoscale Devices," Nano Letters, 2008, pp. 405-410, vol. 8, No. 2, 2008.
(Continued)

*Primary Examiner* — Zandra V Smith
*Assistant Examiner* — Andre C Stevenson
(74) *Attorney, Agent, or Firm* — Haynes and Boone, LLP

(57) ABSTRACT

Devices and methods of forming a FET including a substrate having a first fin and a second fin extending therefrom. A high-k gate dielectric layer and a ferroelectric insulator layer are deposited over the first fin and the second fin. In some embodiments, a dummy gate layer is deposited over the ferroelectric insulator layer over the first fin and the second fin to form a first gate stack over the first fin and a second gate stack over the second fin. The dummy gate layer of the first gate stack is then removed (while maintaining the ferroelectric insulator layer) to form a first trench. And the dummy gate layer and the ferroelectric insulator layer of the second gate stack are removed to form a second trench. At least one metal gate layer is formed in the first trench and the second trench.

20 Claims, 26 Drawing Sheets

(51) Int. Cl.
*H01L 29/51* (2006.01)
*H01L 29/78* (2006.01)
*H01L 21/308* (2006.01)
*H01L 21/311* (2006.01)
*H01L 21/8234* (2006.01)
*H01L 21/265* (2006.01)
*H01L 21/28* (2006.01)

(52) U.S. Cl.
CPC ......... *H01L 21/31144* (2013.01); *H01L 21/823431* (2013.01); *H01L 21/823437* (2013.01); *H01L 21/823468* (2013.01); *H01L 29/40111* (2019.08); *H01L 29/511* (2013.01); *H01L 29/516* (2013.01); *H01L 29/517* (2013.01); *H01L 29/66545* (2013.01); *H01L 29/66795* (2013.01); *H01L 29/785* (2013.01); *H01L 29/513* (2013.01)

(56) References Cited

U.S. PATENT DOCUMENTS

2019/0096767 A1* 3/2019 Yeh ................. H01L 21/02181
2019/0207009 A1* 7/2019 Yamaguchi ........... H01L 29/513
2019/0287967 A1* 9/2019 Liaw ................. H01L 27/1108
2019/0346404 A1* 11/2019 Tan .................. H01L 29/78391

OTHER PUBLICATIONS

Sumitha George et al., "NCFET Based Logic for Energy Harvesting Systems," SRC Technology 2015, 4pp.

\* cited by examiner

NEGATIVE CAPACITANCE FINFET AND METHOD OF FABRICATING THEREOF

CROSS-REFERENCE TO RELATED APPLICATIONS

This application claims the benefit of U.S. Provisional Application No. 62/712,298, filed Jul. 31, 2018, hereby incorporated herein by reference.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

Transistors are circuit components or elements that are often formed as a part of semiconductor fabrication. A field effect transistor (FET) is one type of transistor. Typically, a transistor includes a gate stack formed between source and drain regions. One emerging trend is providing FETs for use as negative capacitance devices. Negative capacitance devices are those that when the applied voltage is increased, the charge goes down. Negative capacitance devices are desirable for controlling (e.g., lowering) a subthreshold swing, which can improve power dissipation performance. In fact, one benefit of negative capacitance devices is the possibility to achieve sub-60 mV/decade subthreshold swing (below the Boltsmann limit of a FET).

Three dimensional transistors with fin active regions are often desired for enhanced device performance as the scaling of the transistors decrease. Three dimensional FETs formed on fin active regions are also referred to as FinFETs. FinFETs are designed to have narrow widths for short channel control and decreasing gate lengths to meet the desired scaling. Fabrication of such FinFETs providing adequate performance, such as implementation as negative capacitance devices, becomes more and more challenging. Therefore, there is a need for a structure and method for fin-based transistors to address these concerns.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
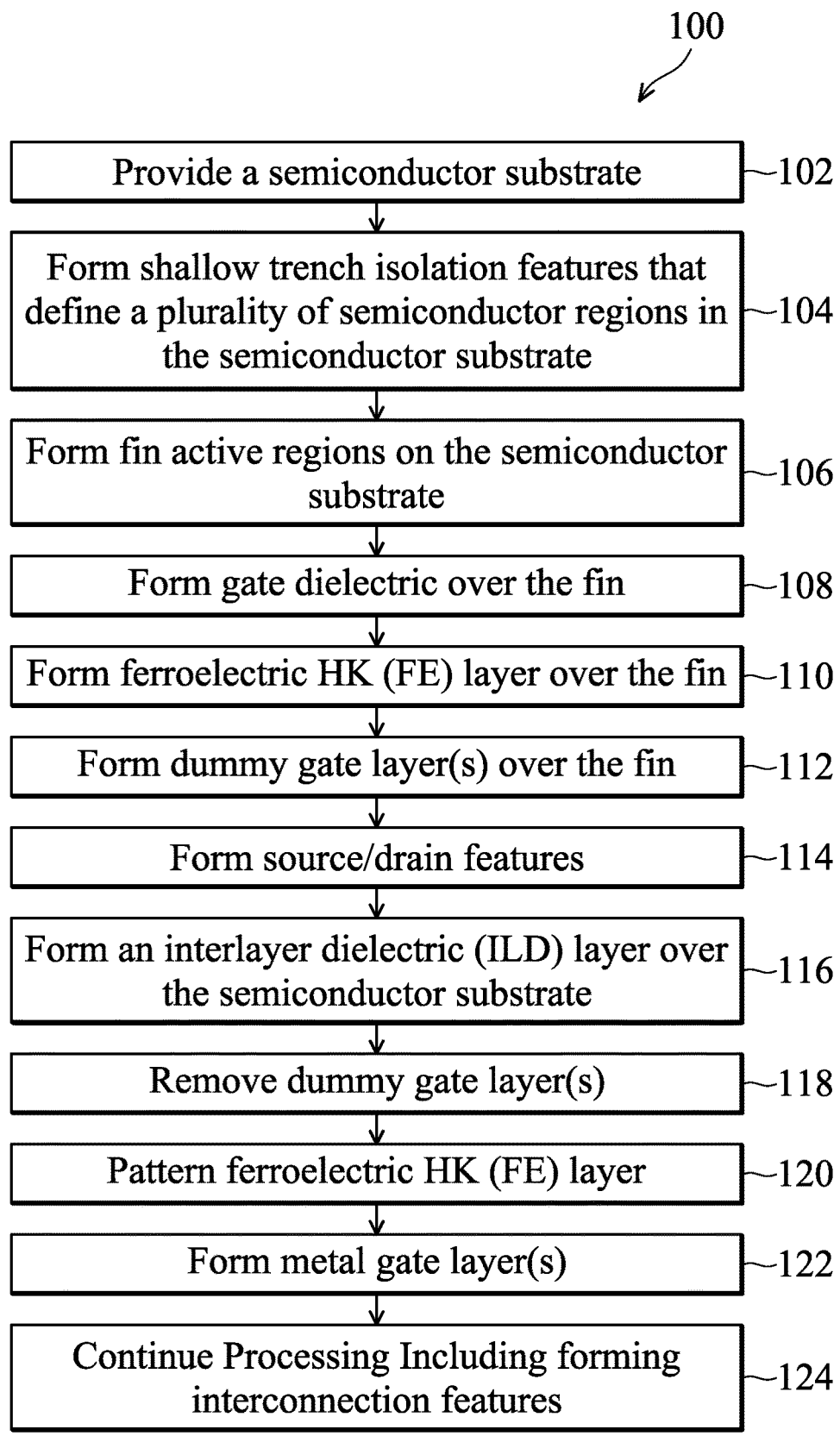
FIG. 1 is a flow chart illustrating an embodiment of a method of fabricating a fin-based FETs according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Negative capacitance devices can be implemented by providing gate-to-channel coupling with negative capacitance gate insulators of ferroelectric FETs. Ferroelectric materials, with proper dopant concentration and post annealing conditions, can achieve a negative-capacitance (NC) effect for field effect transistors (FETs). The NC effect can be useful in certain circuit applications. However, existing negative-capacitance FETs and the method of their fabricating still have shortcomings. For example, the fabrication of a negative-capacitance FET may require a sufficient thickness of the ferroelectric layer to obtain desired performance (e.g., drain current (Ids) and steep-slope (SS) behavior). However, implementing sufficient thickness for a ferroelectric material of negative-capacitance FET as a fin-type field effect transistor (or FinFET) has its challenges. For example, rather than accommodating a rather thin gate dielectric layer (e.g., 10-20A of high-k material), the FinFET design and method of fabricating desirably provides for a larger thickness dielectric to effectuate the NC-FET. As fin pitches decrease with increasing device density, challenges arise in fabricating negative-capacitance designs with suitable ferroelectric insulators.

Further, in addition and/or lieu of the fabrication benefits described above, device performance benefits may also be achieved in some of the methods and structures described herein. For example, the removal and/or thinning of the ferroelectric insulator (and/or high-k dielectric layers) can reduce metal gate signal coupling loss and/or avoid weak corner turn on (WCTO) performance loss. For example, a ferroelectric layer formed on a metal gate sidewall could risk degradation of the performance of WCTO that may be addressed by some of the present embodiments. Simulation results have indicated that in some embodiments, presence of a sidewall ferroelectric layer in the gate can reduce NCFET gain about ⅕ for the same junction profile (for example, with a ferroelectric layer thickness of 1.5 nm at a sidewall of the gate). Without being bound to any theory, this may be because there is less voltage gain in gate-to-source due to smaller gate overlap (Lov). Further, in some simulations, Ion-Vts, Ioff-Vts can show R degradation from ferroelectric layer presence on a sidewall of the gate. In some embodiments, an improvement in device performance can be achieved because WCTO is avoided. The sidewall signal coupling the substrate (e.g., silicon fin) is relatively weaker for a device having ferroelectric layer on its sidewall due to the additional dielectric material in a signal path between the metal gate and the silicon fin. With the ferroelectric layer removed from portions of the sidewall, the gate (e.g., metal gate) is suitable for improved signal coupling to the channel.

Figure 13:
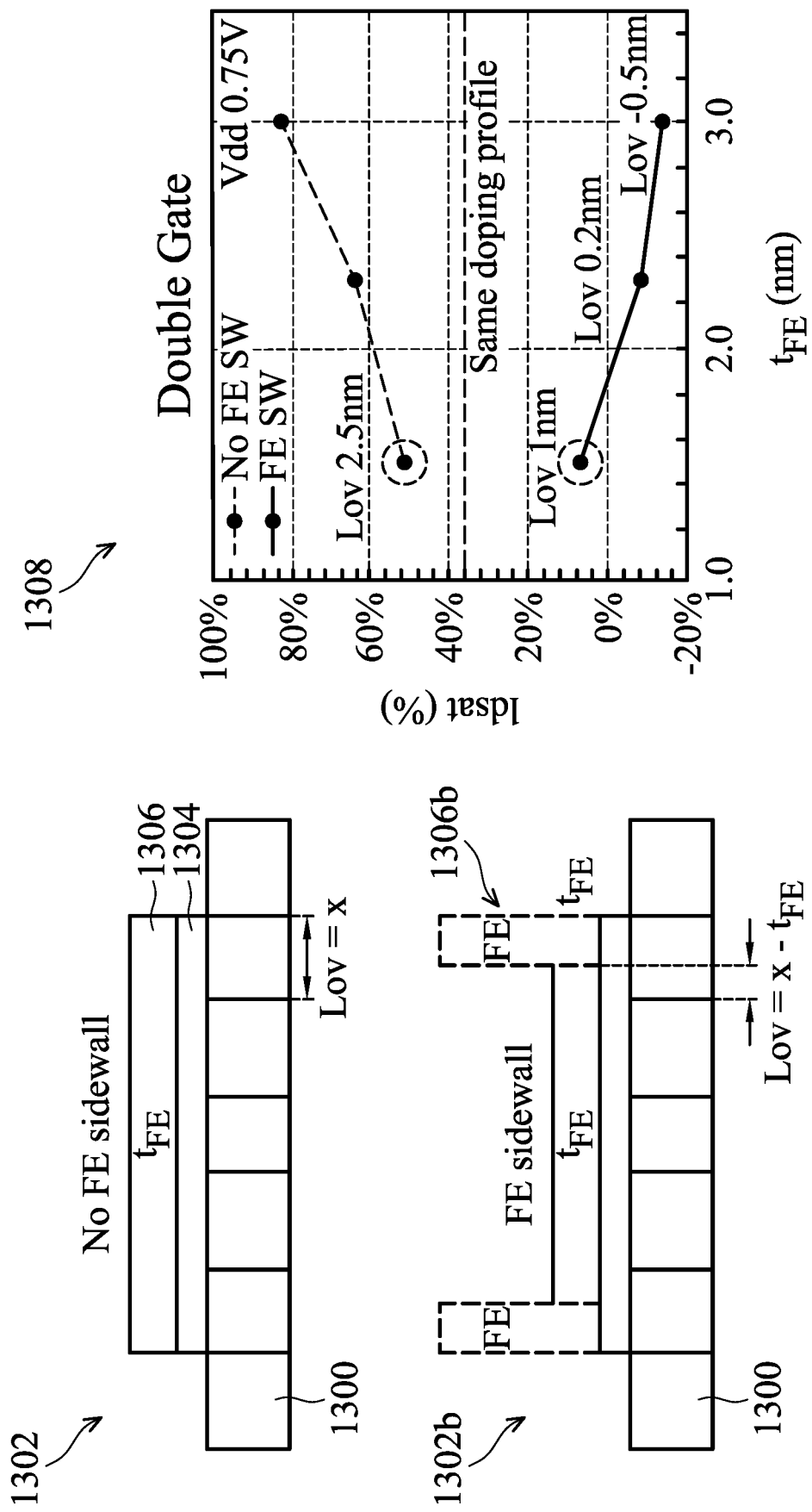
FIG. 13 includes a graphical illustration of performance of certain embodiments of NC-FETs including according to aspects of the present disclosure.

Some of these performance improvements can be illustrated by the example of FIG. 13. It is noted that these same performance considerations can apply to fin-type field effect transistors as well as planar transistors. The presentation of FIG. 13 illustrates a first device structure 1302, which provides a substrate 1300, a dielectric layer 1304 (e.g., interfacial layer), and an overlying ferroelectric layer 1306. A metal gate (not shown) would be disposed over the ferroelectric layer 1306. It is noted that for device structure 1302, there is no ferroelectric layer sidewall. The presentation of FIG. 13 also illustrates a second device structure 1302b, which provides a substrate 1300, a dielectric layer 1304 (e.g., interfacial layer), and an overlying ferroelectric layer 1306b. A metal gate (not shown) would be disposed over the ferroelectric layer 1306b. It is noted that for device structure 1302b, there is ferroelectric layer extending up a sidewall (e.g., of the gate).

The presentation of FIG. 13 includes a graph 1308 which compares the Idsat (%) performance with respect to the ferroelectric layer 1306/1306b thickness. As illustrated by structure 1302b, the ferroelectric layer 1306b can dictate the Lov achieved by the device. That is the thicker the ferroelectric layer 1306b extending upa sidewall of the gate the lower the Lov. Thus, presented herein is methods of controlling and addressing performance impacts of the ferroelectric layer such as ferroelectric layer 1306.

The present disclosure involves methods for fabricating devices including negative-capacitance FETs, while maintaining a suitable pitch for FETs across the device and addressing performance. It is understood, however, that the present application should not be limited to a particular type of device such as a FinFET device, except as specifically claimed. In some embodiments, planar devices may also benefit from aspects of the present disclosure.

FIG. 1 is a flowchart of an embodiment of a method 100 for fabricating a semiconductor structure having transistors constructed according to some embodiments of the present disclosure. FIGS. 2-11B are top or sectional views of a semiconductor structure (or portions thereof) at various fabrication stages. In the present embodiment, the semiconductor structure includes a plurality of fin transistors or FinFETS such as illustrated by the FinFET device 200, some of which may be negative-capacitance fin-based field effect transistors (NC-FinFET). The semiconductor structure and the method 100 making the same are collectively described below with reference to FIGS. 2 through 11B.

Figure 2:
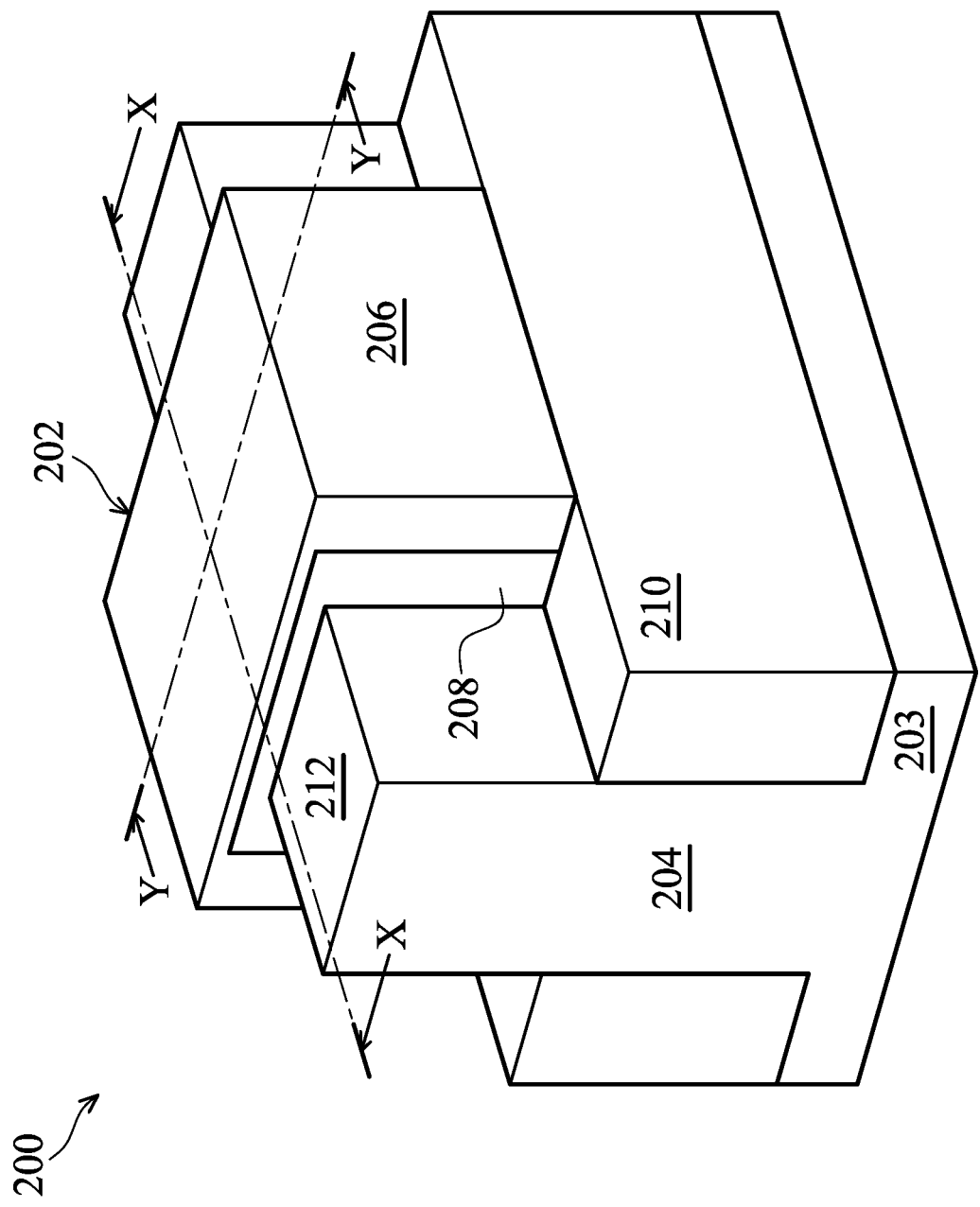
FIG. 2 illustrates a perspective view of an exemplary FinFET device according to various aspects of the present disclosure.

Referring to FIG. 2, a perspective view of an example FinFET device 200 is illustrated. The FinFET device 200 is a non-planar multi-gate transistor that is built over a substrate (such as a bulk substrate) 203. A thin silicon-containing "fin-like" structure 204 (hereinafter referred to as a "fin") forms the body of the FinFET device 200. The fin 204 extends along an X-direction shown in FIG. 1. The fin 204 has a fin width measured along a Y-direction that is orthogonal to the X-direction. A gate 202 of the FinFET device 200 wraps around this fin 204, for example around the top surface and the opposing sidewall surfaces of the fin.

The gate length of the gate 202 is measured in the X-direction, between a source region 212 and a drain region 214. The gate 202 may include a gate electrode component 206 and a gate dielectric component 208. A portion of the gate 202 is located over a dielectric isolation structure such as shallow trench isolation (STI) 210. A source region 212 and a drain region 214 of the FinFET device 200 are formed in extensions of the fin on opposite sides of the gate 202. A portion of the fin 204 being wrapped around by the gate 202 serves as a channel of the FinFET device 200.

FinFET devices such as the FinFET device 200 in some embodiments offer several advantages over traditional Metal-Oxide Semiconductor Field Effect Transistor (MOSFET) devices (also referred to as planar transistor devices) that do not have a protruding fin structure. These advantages may include better chip area efficiency, improved carrier mobility, and fabrication processing that is compatible with the fabrication processing of planar devices.

In some embodiments, the FinFET device 200 is illustrative of a NC-FinFET device. Thus, in an embodiment, the gate dielectric component 208 includes a ferroelectric (FE) material. In some embodiments, the FinFET device 200 is not a NC-FinFET but a standard (i.e., not negative capacitance) transistor. Thus, in an embodiment, the gate dielectric component includes a high-k dielectric (without ferroelectric properties).

As discussed in detail below, numerous FinFET devices 200 are formed on the same semiconductor substrate and form a semiconductor structure (e.g. integrated circuit). In some embodiments, FinFET devices 200 as NC-FinFETs are formed on the same semiconductor substrate as the FinFET devices 200 as standard FETs together forming a semiconductor structure. Methods and devices implementing this configuration are discussed below.

Figure 3:
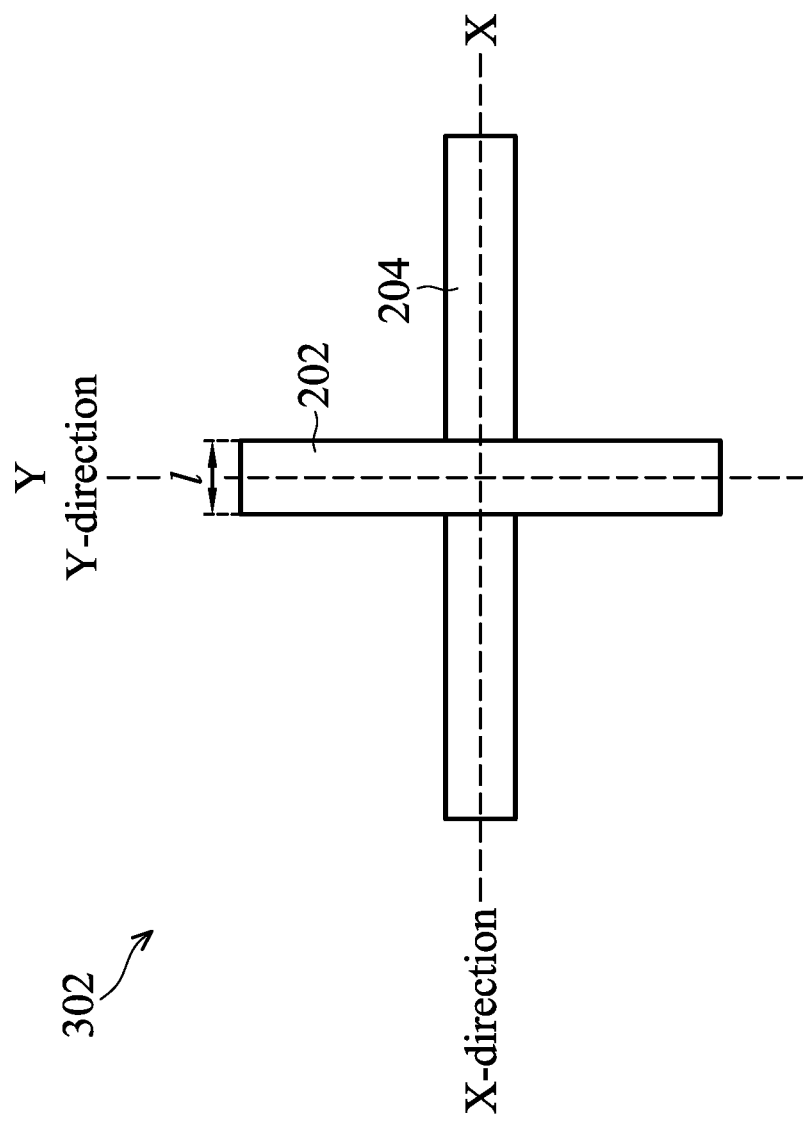
FIGS. 3, 4, and 5 illustrate top views of exemplary FinFET devices according to various aspects of the present disclosure.
Figure 4:
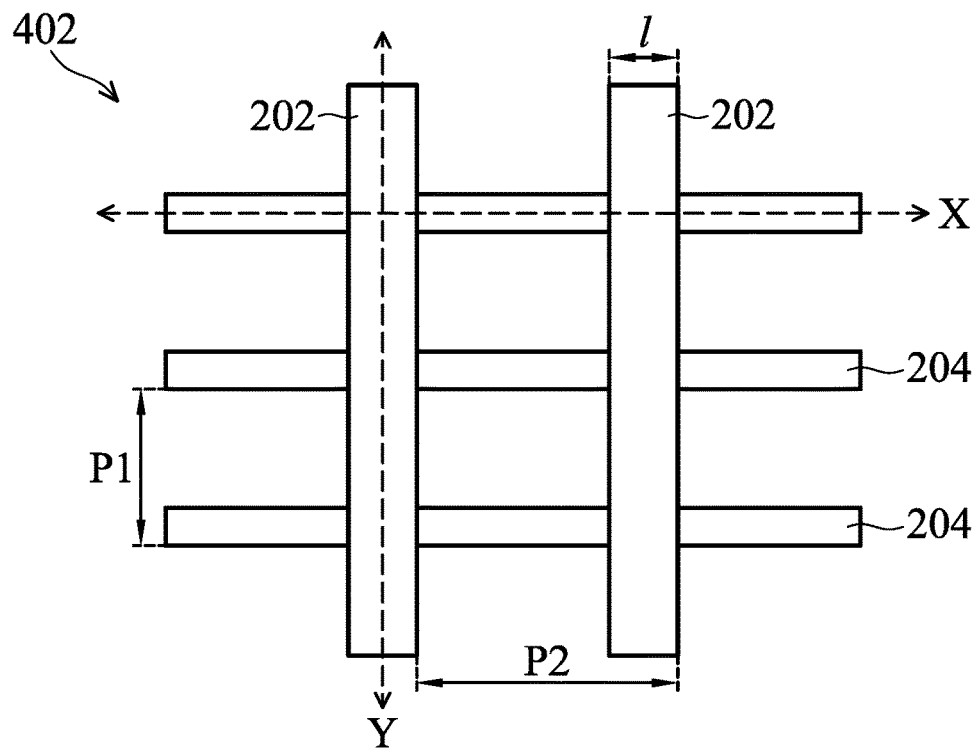
Figure 5:
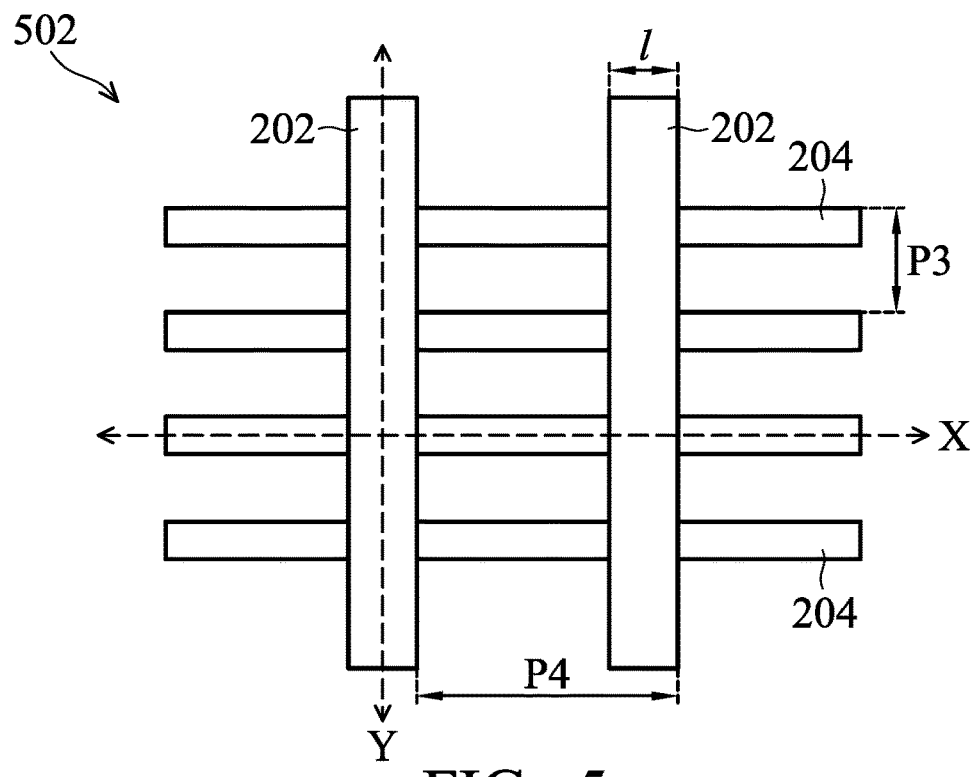

First, FIGS. 3, 4, and 5 illustrate top views of portions of the semiconductor structure that may be fabricated by the method 100. For ease of reference the semiconductor structure discussed as exemplary of the method 100 is referred to as the semiconductor structure 300. As indicated above, the semiconductor structure 300 can include a plurality of FinFET devices 200, including those configured as NC-FinFETs and those as standard FinFETs. In other words, the gate 202 and fin 204 of FIGS. 3, 4, and/or 5 may be substantially similar to as discussed with reference to the FinFET device 200 of FIG. 2.

FIG. 3 illustrates a top view of a portion 302 of the semiconductor structure 300. The portion 302 illustrates a gate 202 traversing a single fin 204. FIG. 4 illustrates a top view of a portion 402 of the semiconductor structure 300. The portion 402 illustrates a plurality of gates 202 each traversing a plurality of fins 204. The fins 204 are spaced at a first pitch P1. The gates 202 are spaced a pitch P2. FIG. 5 illustrates a top view of a portion 502 of the semiconductor structure 300. The portion 502 illustrates a plurality of gates 202 each traversing a plurality of fins 204. The fins 204 are spaced at a pitch P3. The gates 202 are spaced a pitch P4.

In an embodiment, each of portion 302, 402, and 502 are formed on the same semiconductor substrate and together, with a plurality of other FETs, form the semiconductor structure (e.g., integrated circuit) 300. In some embodiments, the gates 202 of each of the portion 302, 402, and 502 are spaced at a same pitch, referred to as providing a single, global gate structure pitch. Thus, in some embodiments, P2 is equal to P4. In some embodiments, P2 and/or P4 are between approximately 38 and 45 nanometers (nm). In some embodiments, the length (l) of gates 202 may be between approximately 8 and 12 nanometers. In some embodiments, the fins 204 of each of the portion 302, 402, and 502 are spaced at a different pitch. For example, in some embodiments, P1 is greater than P3. In an embodiment, P1 is between approximately 22 and 32 nanometers. In an embodiment, P2 is between approximately 20 and 26 nanometers. The smaller pitch can provide for more challenges in the fabrication of devices on said fins 204.

Referring again to FIG. 1, a method of fabricating semiconductor structure including the components of FIGS. 2, 3, 4, and 5 is provided. For ease of understanding, FIGS. 6A, 7A, 8A, 9A, 10A, and 11A illustrate diagrammatic fragmentary cross-sectional side views of the exemplary semiconductor structure 300 at various stages of fabrication, and FIGS. 6B, 8B, 9B, 10B, and 11B illustrate different diagrammatic fragmentary cross-sectional side views of the exemplary semiconductor structure 300 at various stages of fabrication. The cross-sectional side views of FIGS. 6B, 8B, 9B, 10B, and 11B are obtained by "cutting" the semiconductor structure along the Y-axis illustrated in FinFET device 200, and as such FIGS. 6B, 8B, 9B, 10B, and 11B may be referred to as Y-cut drawings. The Y-cut drawings are cut along a gate structure. The cross-sectional side views of FIGS. 6A, 7A, 8A, 9A, 10A, and 11A are obtained by "cutting" the semiconductor structure along the X-axis illustrated in FinFET device 200, and as such FIGS. 6A, 7A, 8A, 9A, 10A, and 11A may be referred to as X-cut drawings. The X-cut drawings are cut along a fin structure.

The semiconductor structure 300 of FIGS. 6A-11B illustrates a FET formed on each of three portions of the semiconductor structure 300. This illustrative FET is representative only and a typical semiconductor structure such as the semiconductor structure 300 would include a plurality of FETs in each region. The three portions of the semiconductor structure 300 correspond to the three layouts discussed above with reference to FIGS. 3, 4, and 5 respectively.

Figure 6A:
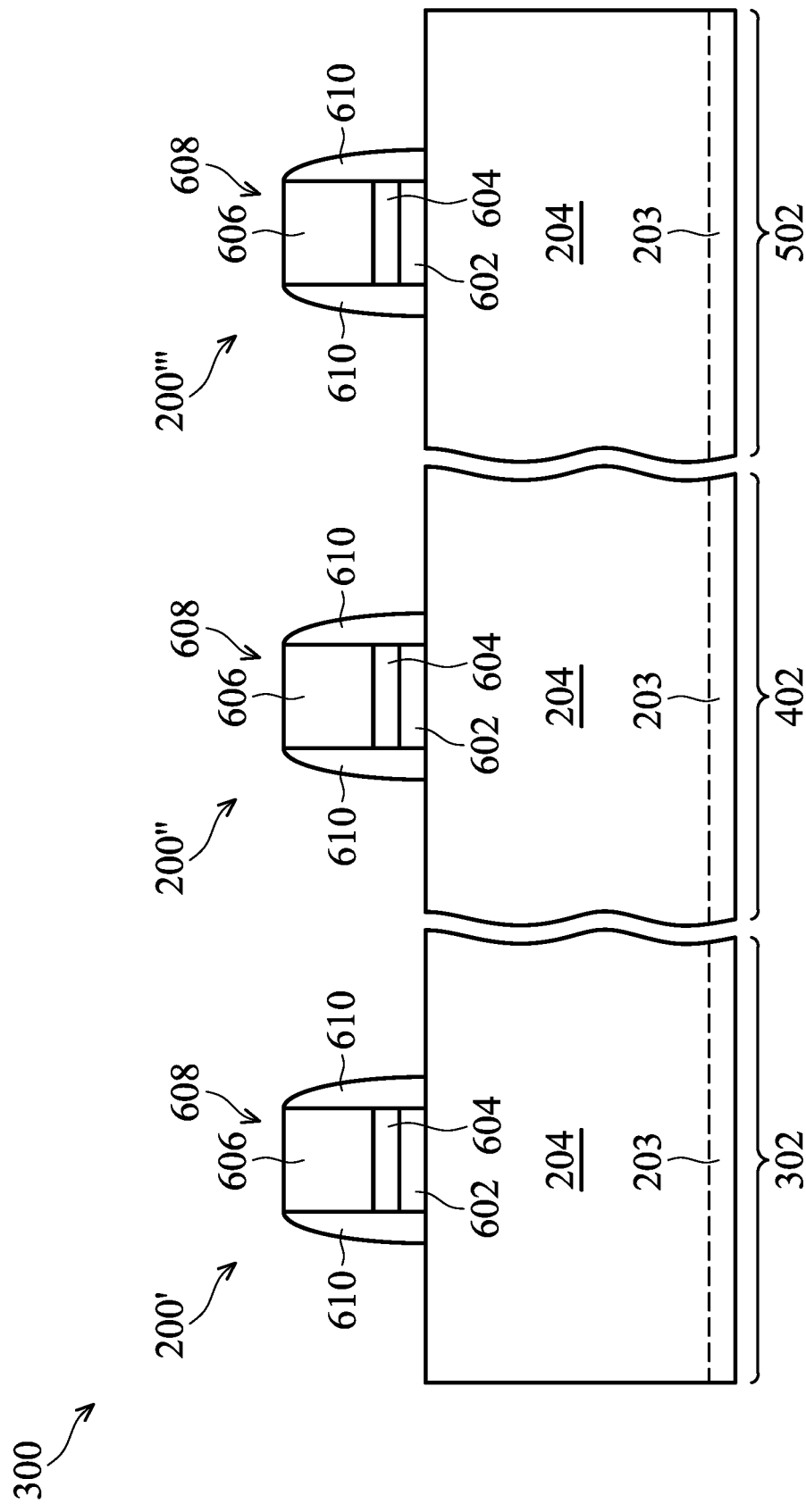
FIGS. 6A, 6B, 7A, 8A, 8B, 9A, 9B, 10A, 10B, 11A and 11B are cross-sectional views of magnified portions of FinFET devices according to various embodiments of the present disclosure.
Figure 6B:
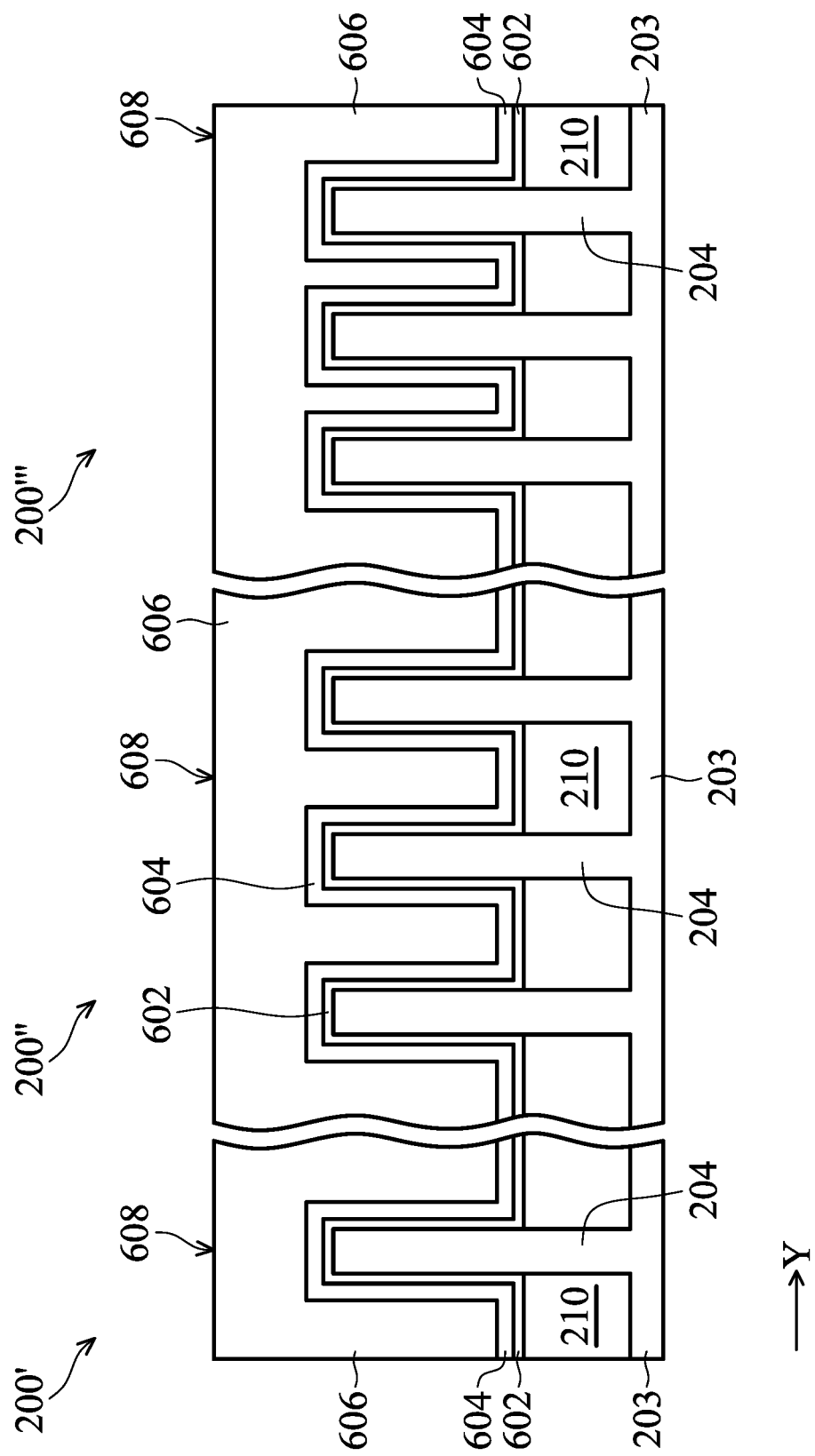

The method 100 begins at block 102 where a semiconductor substrate is provided. Referring to FIGS. 6A and 6B, the method 100 begins with block 102 by providing a semiconductor substrate 203. Again, FIG. 6A is an X-cut and FIG. 6B is a Y-cut.

In an embodiment, the semiconductor substrate 203 includes silicon. In some other embodiments, the substrate 203 includes germanium, silicon germanium or other proper semiconductor materials. The substrate 203 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor substrate 203 includes an epitaxy (or epi) semiconductor layer. In some embodiments, the substrate 203 may be a semiconductor on insulator, such as silicon on insulator (SOI).

The substrate 203 includes a first region 302, a second region 402 and a third region 502, which may be substantially similar to as discussed above with reference to FIGS. 3, 4, and 5 respectively. In some embodiments, region 302 is designed to include standard cell including a transistor having an active region in a single fin 204. In some embodiments, region 402 is designed to include a transistor having an active region in a plurality of fins 204, the fins of the region 402 formed a relaxed pitch such as P1 discussed above with reference to FIG. 4. In some embodiments, region 502 is designed to include a transistor having an active region in a plurality of fins 204, the fins of the region 502 formed a tightened pitch (e.g., relative to region 402) such as P3 discussed above with reference to FIG. 5. In some embodiments, each of regions 302, 402, and 502 may include transistors forming a core device of the semiconductor structure. In other embodiments, the regions 402 and/or 502 may form input/output (I/O) devices such as discussed below with reference to FIGS. 11A and 11B.

The method 100 then proceeds to blocks 104 and 106 where isolation features and fin active regions are formed on the semiconductor substrate. Still referring to the examples of FIGS. 6A and 6B, the method 100 proceeds to forming shallow trench isolation (STI) features 210 and fins 204 on the semiconductor substrate 203.

In some examples, the STI features 210 and fins 204 are formed on the substrate 203 by patterning the substrate to form recesses, filling the recesses with insulating material and then recessing the insulating material such that the fins 204 extend above the insulating material (which forms STI features 210). For example, in some embodiments, a hard mask is deposited on the substrate 203 and is patterned by lithography process. A photoresist layer (or resist) used to define the fin structure may be formed on the hard mask layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning. In one embodiment, the resist layer is patterned to leave the portions of the photoresist material disposed over the semiconductor substrate 203 by the lithography process. After patterning the resist, an etching process is performed on the semiconductor substrate 203 to open the hard mask layer, thereby transferring the pattern from the resist layer to the hard mask layer. The remaining resist layer may be removed after the patterning the hard mask layer. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. Then etching process may be followed to etch the portions of the substrate 203 not covered by the patterned hard mask layer.

The patterned hard mask layer is used as an etch mask during the etching processes to pattern the substrate 203. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 203 is partially etched. This may be achieved by controlling etching time or by controlling other etching parameter(s). After the etching processes, the fin structure 204 with fin active regions is defined on and extended from the substrate 203.

One or more dielectric materials are filled in the trenches to form the STI feature 210. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a HDP-CVD process, a sub-atmospheric CVD (SACVD) process, a high-aspect ratio process (HARP), a flowable CVD (FCVD), and/or a spin-on process. The deposition of the dielectric material may be followed by a chemical mechanical polishing/planarization (CMP) process to remove the excessive dielectric material and planarize the top surface of the semiconductor structure. The formed STI features 210 may be recessed such that the fin active regions 204 are extended above the STI features 210. The recessing process employs one or more etching steps (such as dry etch, wet etch or a combination thereof) to selectively etch back the STI features 210. For example, a wet etching process using hydrofluoric acid may be used to etch when the STI features 210 are silicon oxide. Other manners of forming the fins 204 and isolation features 210 are also possible including forming the isolation features 210 and subsequently growing (epitaxially) the fins 204 from openings in the isolation feature 210.

The fin active regions 204 are spaced from each other in a first direction (Y direction). The fin active regions 204 have elongated shape and oriented along a second direction (X direction). The configuration of the fins 204 provided by the method 100 may include a variety of pitches for the fins 204, such as defined by the photolithography steps discussed above. For example, fins 204 having a pitch P1 and P3 may each be formed on the substrate 203. Various doping processes may be applied to the semiconductor regions including the fins 204 to form various doped wells, such as n-wells and p-wells.

The method 100 proceeds to block 108 where a gate dielectric layer is formed over the fins. Still referring to the example of FIGS. 6A and 6B, a dielectric layer 602 may be formed on the substrate 203 including over the fins 204. In some embodiments, the dielectric layer 602 includes a high-k dielectric material, which has a dielectric constant greater than the dielectric constant of silicon oxide. As such, the dielectric layer 602 may also be referred to as a high-k dielectric layer. The high-k dielectric layer 602 may include metal oxide, metal nitride, such as LaO, AlO, ZrO, TiO, $Ta_2O_5$, $Y_2O_3$, BaZrO, HfZrO, HfLaO, HfSiO, LaSiO, AlSiO, HfTaO, HfTiO, (Ba,Sr)TiO3 (BST), $Al_2O_3$, $Si_3N_4$, oxynitrides (SiON), or other suitable dielectric materials. The gate dielectric layer 602 may further includes an interfacial layer disposed between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer 602 is deposited on the interfacial layer (if the interfacial layer is formed) by a suitable technique, such as ALD, CVD, metal-organic CVD (MOCVD), PVD, thermal oxidation, combinations thereof, and/or other suitable techniques. The high-k dielectric layer 602 may be deposited as a blanket (conformal) layer and subsequently patterned, such as discussed below. In an embodiment, the high-k dielectric layer is deposited having a thickness of between approximately 10 and 20 Angstroms.

The method 100 then proceeds to block 110 where a ferroelectric insulator layer is formed over the fins. Still referring to the example of FIGS. 6A and 6B, a ferroelectric insulator layer 604 may be formed on the substrate 203 including over the fins 204. In some embodiments, the ferroelectric insulator layer 604 includes a high-k dielectric material having ferroelectric properties. As such, the ferroelectric insulator layer 604 may also be referred to as a HK (FE) layer. The ferroelectric insulator layer 604 may include HfZrO2, HfAlO2, PbZrTiO3 (or PZT), SrTiO3, BaTiO3, combinations thereof, or other suitable materials providing high polarizability. The ferroelectric insulator layer 604 may be formed directly on the high-k dielectric layer 602. The ferroelectric insulator layer 604 may be deposited by a suitable technique, such as ALD, CVD, metal-organic CVD (MOCVD), PVD, combinations thereof, and/or other suitable techniques. The ferroelectric insulator layer 604 may be deposited as a blanket layer and subsequently patterned, such as discussed below. In an embodiment, the thickness of the ferroelectric insulator layer 604 is between approximately 2 and 5 nanometers. The composition of the ferroelectric insulator layer may be important to provide the nonlinear capacitance of the NC-FET providing a negative change in polarizability for a change in voltage applied to the gate. The thickness of the ferroelectric insulator layer 604 may also be important to the resulting FET performance. As the ferroelectric layer 604 increases in thickness, the layer's capacitance decreases; in operation in the NC-FET this means that more negative voltage drop across the ferroelectric layer and thus, the increase of positive voltage and Ids. Further, a sufficient thickness of ferroelectric insulator layer 604 is needed such that crystallization of the layer occurs and it achieves suitable ferroelectric performance.

The composition of the high-k dielectric layer 602 and the ferroelectric insulator layer 604 are selected such as together the layers are operable to provide for a negative-capacitance FET, when a gate electrode is formed thereover. The high-k dielectric layer 602 can provide for control over gate leakage and reliability requirements for the device (e.g., avoiding breakdown). In some embodiments, the thickness of the high-k dielectric layer 602 is thinner than ferroelectric insulator layer 604. In an embodiment, the thickness ratio between high-k dielectric layer 602 and ferroelectric insulator layer 604 is between approximately ~0 to 0.5. In other words, in some embodiments, the high-k dielectric layer 602 may be omitted. For example, if the gate leakage and reliability of gate performance is sufficient with the ferroelectric insulator layer 604, a high-k dielectric layer may be omitted.

It is noted that there may be an interfacial layer (not shown) between high-k dielectric layer 602 and high-k ferroelectric insulator layer 604. This interfacial layer may form during an anneal process. The anneal process may be performed after the high-k dielectric layer 602 and the ferroelectric insulator layer 604 are formed. In an embodiment, the anneal process is performed at a temperature of greater than about 900 C.

In an embodiment, the high-k dielectric layer 602 is undoped HfO2, while the ferroelectric insulator layer 604 is HfZrO2 (thus, HfO2 doped with Zr). In an embodiment, the high-k dielectric layer 602 is undoped HfO2, while the ferroelectric insulator layer 604 is HfAlO2 (thus, HfO2 doped with Al).

The method 100 then proceeds to block 112 where a dummy gate material is formed over the fins. After deposition of the high-k dielectric layer 602 and the ferroelectric insulator layer 604, a dummy gate material 606 is formed on the substrate 203. In an embodiment, the dummy gate material includes a conductive material, such as polysilicon. In an embodiment, the dummy gate material is non-conductive. After deposition of the dummy gate material, the dummy gate material 606, high-k dielectric layer 602 and ferroelectric layer 604 are patterned to form a gate stack 608. The gate stack 608 may be referred to as a dummy gate stack because at least one layer is sacrificial (i.e., dummy gate material 606).

Patterning the gate stack may be by photolithography processes similar to as discussed above with reference to blocks 104 and 106. In some embodiments, a gate hard mask (not shown) may be formed on the gate stack—the dummy gate material 606, high-k dielectric layer 602 and ferroelectric layer 604—and the hard mask used as an etch mask during the formation of the gate stacks. The gate hard mask may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the gate stacks 608 includes forming a patterned resist layer on the hard mask by lithography process; etching the hard mask using the patterned resist layer as an etch mask; and etching the gate materials to form the gate stacks 608 using the patterned hard mask as an etch mask.

The gate stacks 608 including the dummy gate material 606, high-k dielectric layer 602 and ferroelectric layer 604 are illustrated in FIGS. 6A and 6B. After the patterning of the dummy gate material 606, high-k dielectric layer 602 and ferroelectric layer 604, one or more spacer elements 610 are formed on the sidewalls of the gate stacks 606. The gate spacers 610 may be used to offset the subsequently formed source/drain features and may be used for designing or modifying the source/drain structure profile. The gate spacers 610 are also used in the method 100 to define a trench during the replacement gate process that removes the dummy gate material 606, as discussed above. The gate spacers 610 may include any suitable dielectric material, such as a semiconductor oxide, a semiconductor nitride, a semiconductor carbide, a semiconductor oxynitride, other suitable dielectric materials, and/or combinations thereof. The gate spacers 610 may have multiple films, such as two films (a silicon oxide film and a silicon nitride film) or three films ((a silicon oxide film; a silicon nitride film; and a silicon oxide film). The formation of the gate spacers 610 includes deposition and anisotropic etching, such as dry etching.

Each of FIGS. 6A and 6B show portions of the semiconductor structure 300 including a first FET 200', a second FET 200", and a third FET 200'". Each of the first FET 200', the second FET 200", and the third FET 200'" may be substantially similar to the FET 200, discussed above with reference to FIG. 2, however currently presented as having a "dummy" gate structure 608 including at least one sacrificial layer (dummy gate material 606). In an embodiment, the first FET 200' is formed in the portion 302 of the semiconductor structure 300, the portion 302 discussed above with reference to FIG. 3. In an embodiment, the second FET 200" is formed in the portion 402 of the semiconductor structure 300, the portion 402 discussed above with reference to FIG. 4. In an embodiment, the third FET 200'" is formed in the portion 502 of the semiconductor structure 300, the portion 502 discussed above with reference to FIG. 5. Thus, in some embodiments, the second FET 200" is formed with fins 204 at a greater pitch than the fins 204 of the third FET 200'".

Figure 7A:
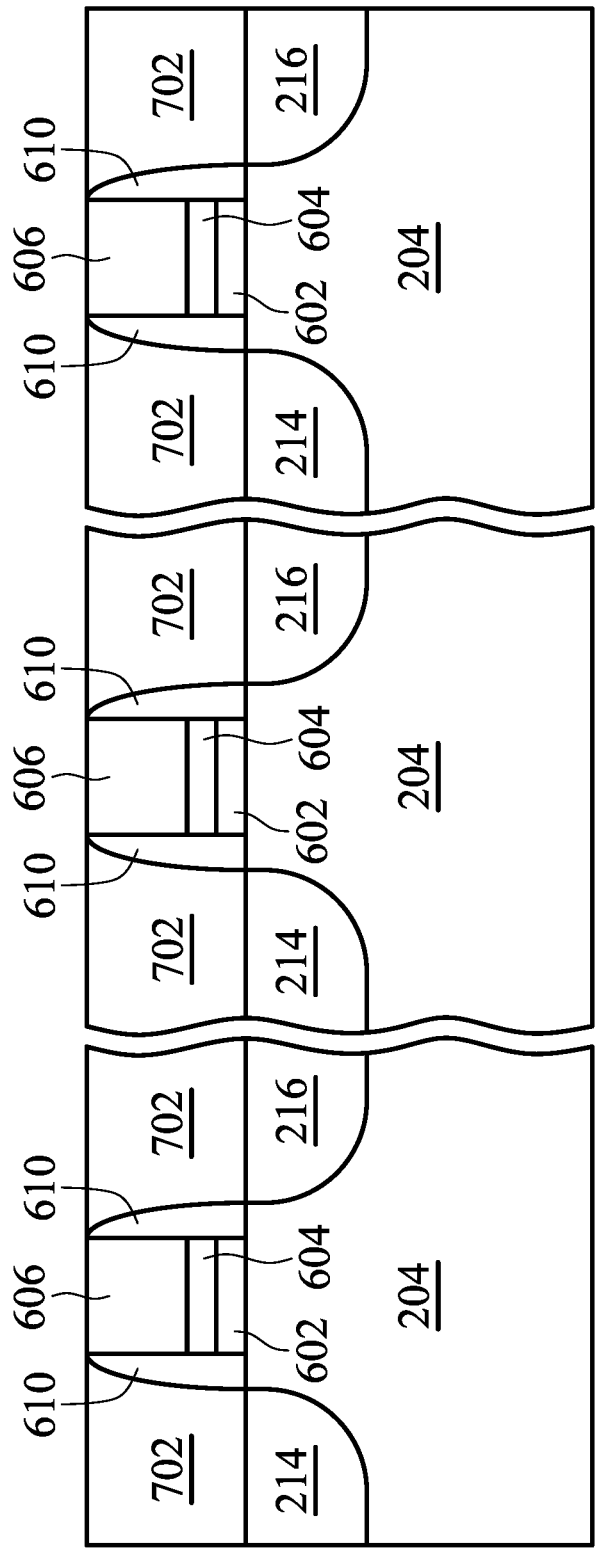

The method 100 then proceeds to block 114 where source/drain regions are formed on/over the fins. Referring to FIG. 7A, the semiconductor structure 300 is illustrated with various source features 212 and drain features 214 to the respective FinFETs 200', 200", and 200'". (It is noted that the cross-section of FIG. 6B also corresponds to the device of FIG. 7A as the source/drain, spacers or ILD are not illustrated in the Y-cut along the gate.) Each field effect transistor includes source and drain features 212, 214 formed on the respective fin 204 active region and interposed by the gate stack 608. A channel is formed in the fin 204 active region in a portion that is underlying the gate stack and spans between the source and drain features. The source features 212 and the drain features 214 may include both light doped drain (LDD) features and heavily doped source and drain (S/D). In some embodiments, the source features 212 and the drain features 214 are formed by epitaxially growing source/drain material on the fins 204. In some embodiments, the source features 212 and the drain features 214 are formed by etching a trench in the fin 204 and epitaxially growing portions of the source features 212 and the drain features 214 in and over the trench.

In that affect, raised source/drain features 212/214 may be formed by selective epitaxy growth for strain effect with enhanced carrier mobility and device performance. The gate stacks 608 and gate spacer 610 constrain the source/drain features 212/214 to the source/drain regions. In some embodiments, the source/drain features 212/214 are formed by one or more epitaxy or epitaxial (epi) processes, whereby Si features, SiGe features, SiC features, and/or other suitable features are grown in a crystalline state on, over or in the fins 204. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin 204.

The source/drain regions 212/214 may also be N-type doped or P-type doped, depending on whether the FinFET device 200 is a PFET or an NFET. For N-type doped source/drain regions 212/214, they may include, as examples, SiP, SiAs, SiGeP, SiGeAs, GeP, GeAs, or other SiGeSn III-V group compounds. For P-type doped source/drain regions 212/214, they may include, as examples, SiB, SiGa, SiGeB, SiGeGa, GeB, GeGa, or other SiGeSn III-V group compounds.

The method 100 then proceeds to block 116 where an interlayer dielectric (ILD) layer is formed over the substrate. Referring still to FIGS. 7A (and 6B), an inter-level dielectric material (ILD) layer 702 is formed on the substrate 203. The ILD layer 702 surrounds the dummy gate stacks 608 and the gate spacers 610. The ILD layer 702 allows portions of the gate stacks 608 to be removed and a replacement gate to be formed in the resulting cavity (also referred to as gate trench) as discussed below. The ILD layer 702 also acts as an insulator that supports and isolates the conductive features (e.g., contacts) later formed to contact the respective FET features including source/drain regions 212/214. The ILD layer 702 may include any suitable dielectric material, such as a semiconductor oxide, a semiconductor nitride, a semiconductor oxynitride, low-k dielectric materials, other suitable dielectric materials, or combinations thereof. In some embodiments, the formation of the ILD layer 702 includes suitable deposition and CMP to provide a planarized top surface exposing the top surface of dummy gate material 606.

Figure 8A:
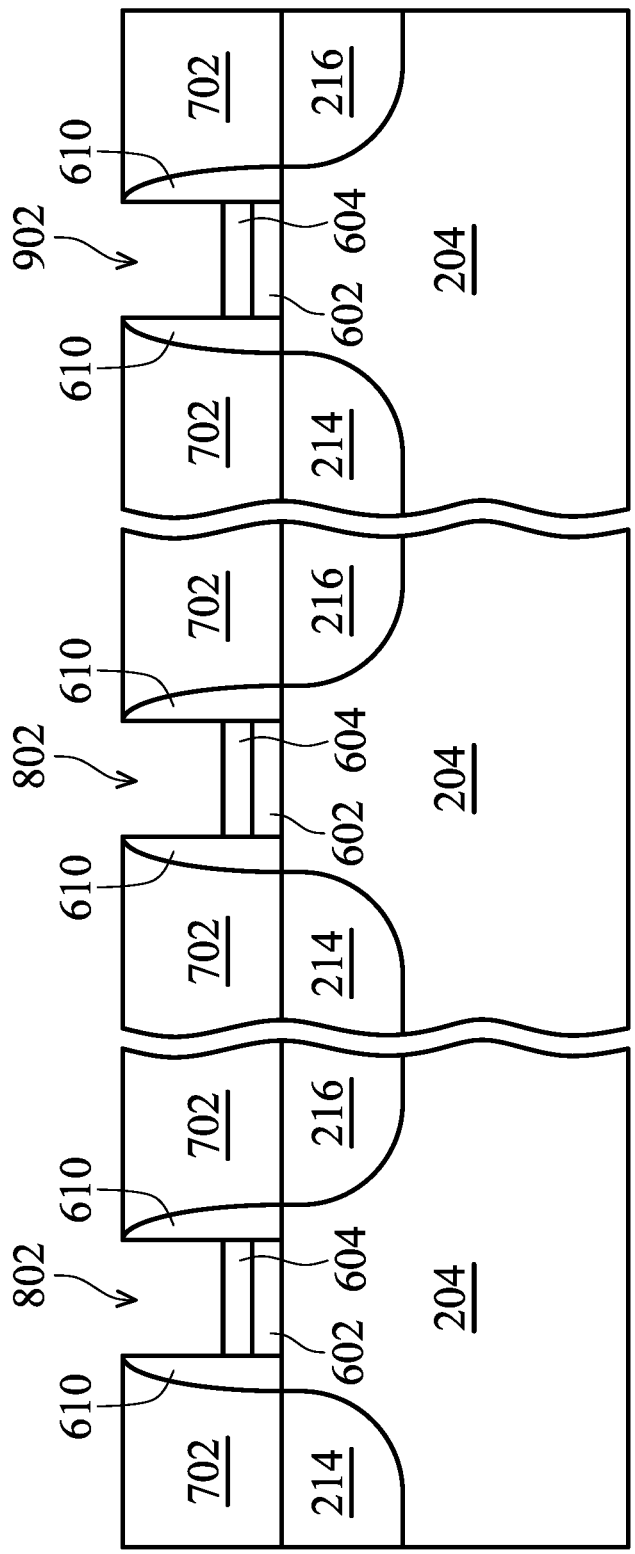
Figure 8B:
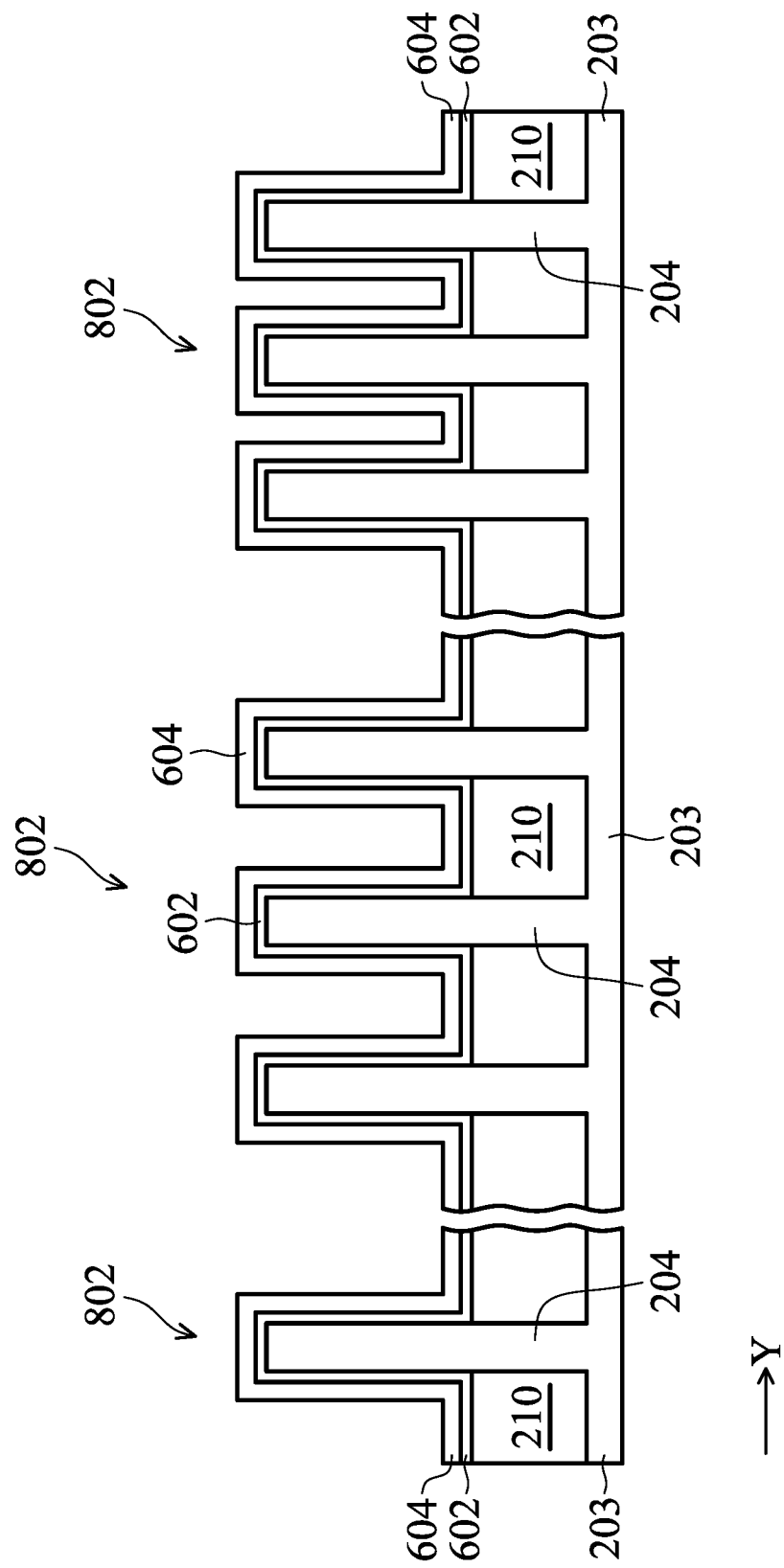
Figure 9A:
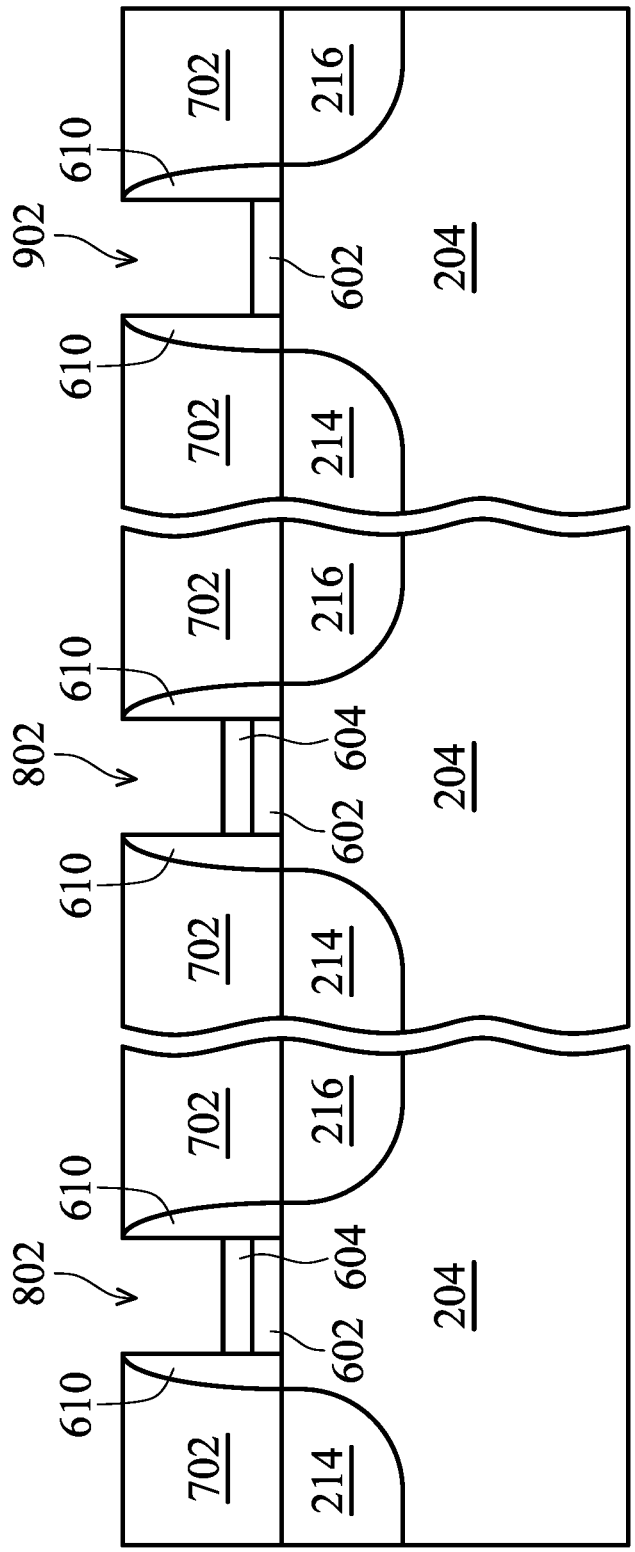
Figure 9B:
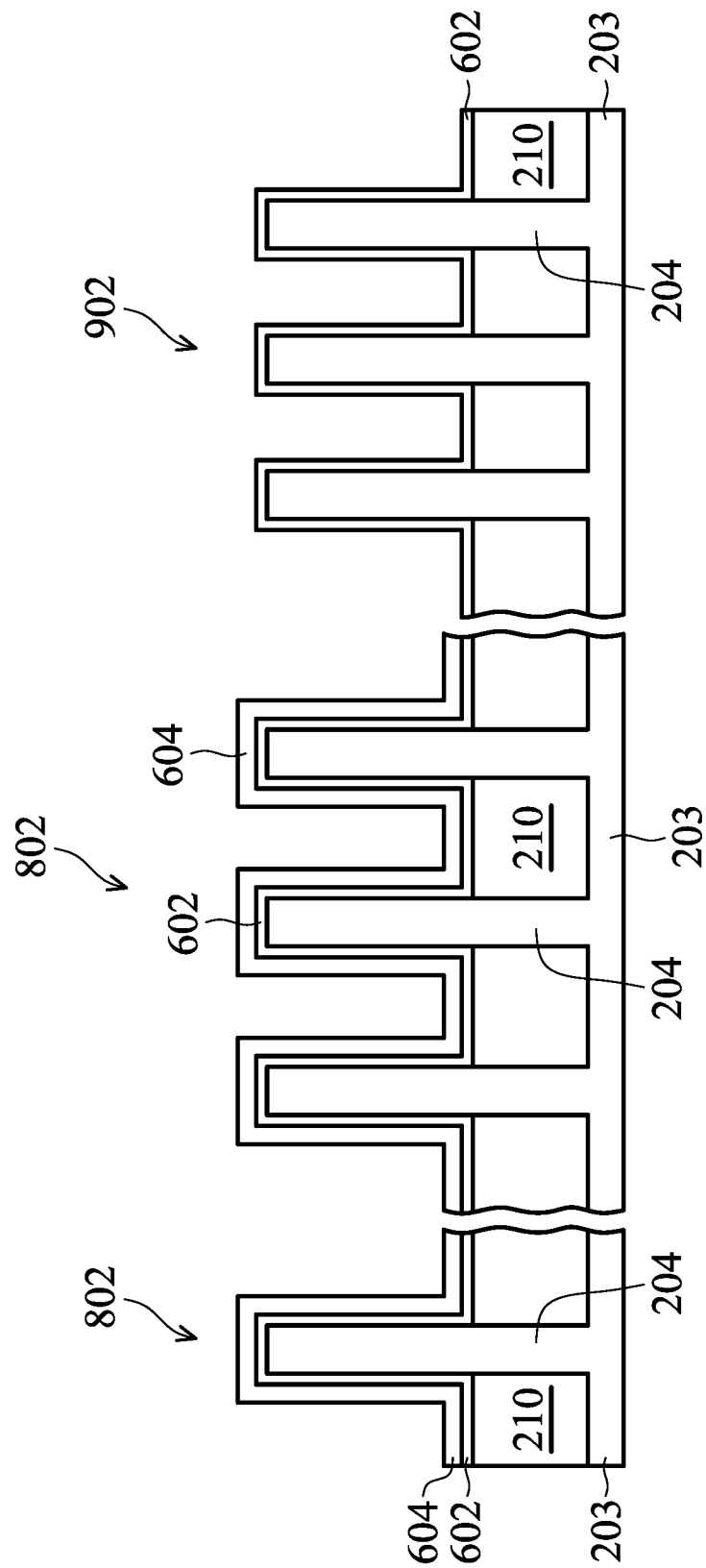
Figure 10A:
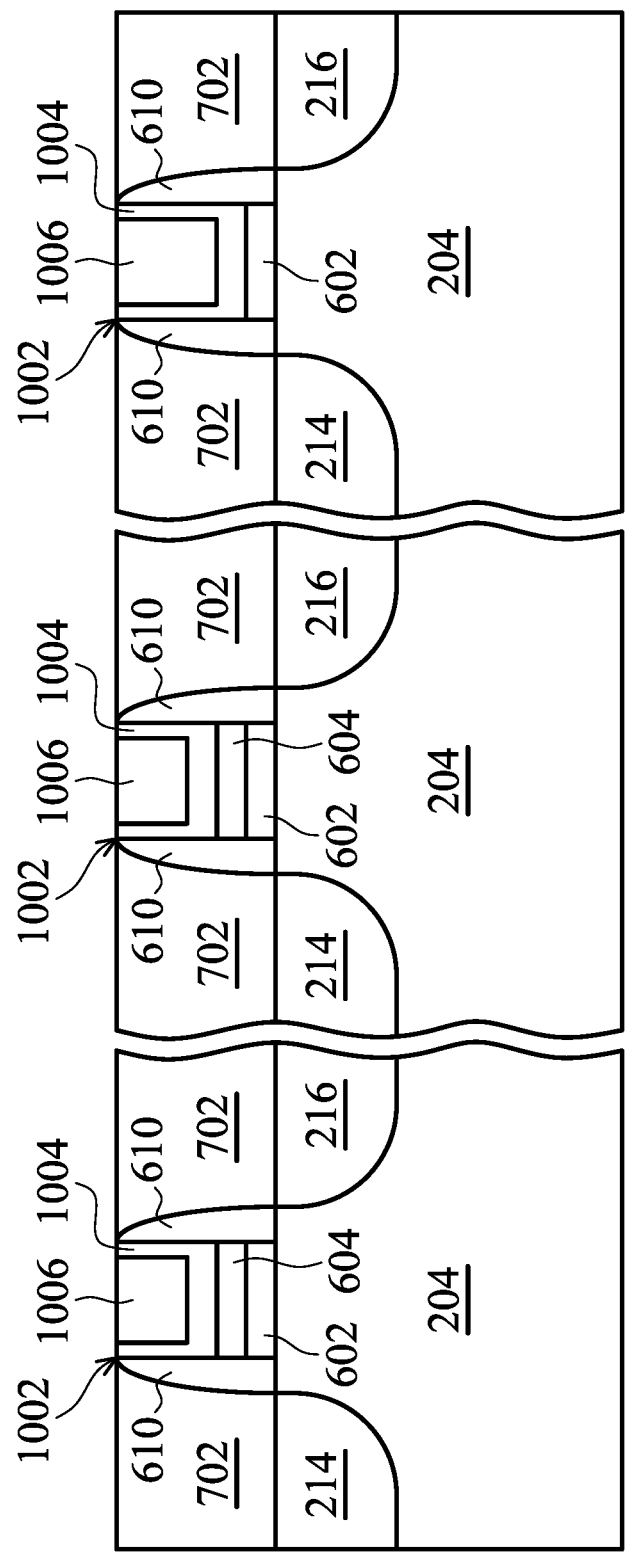
Figure 10B:
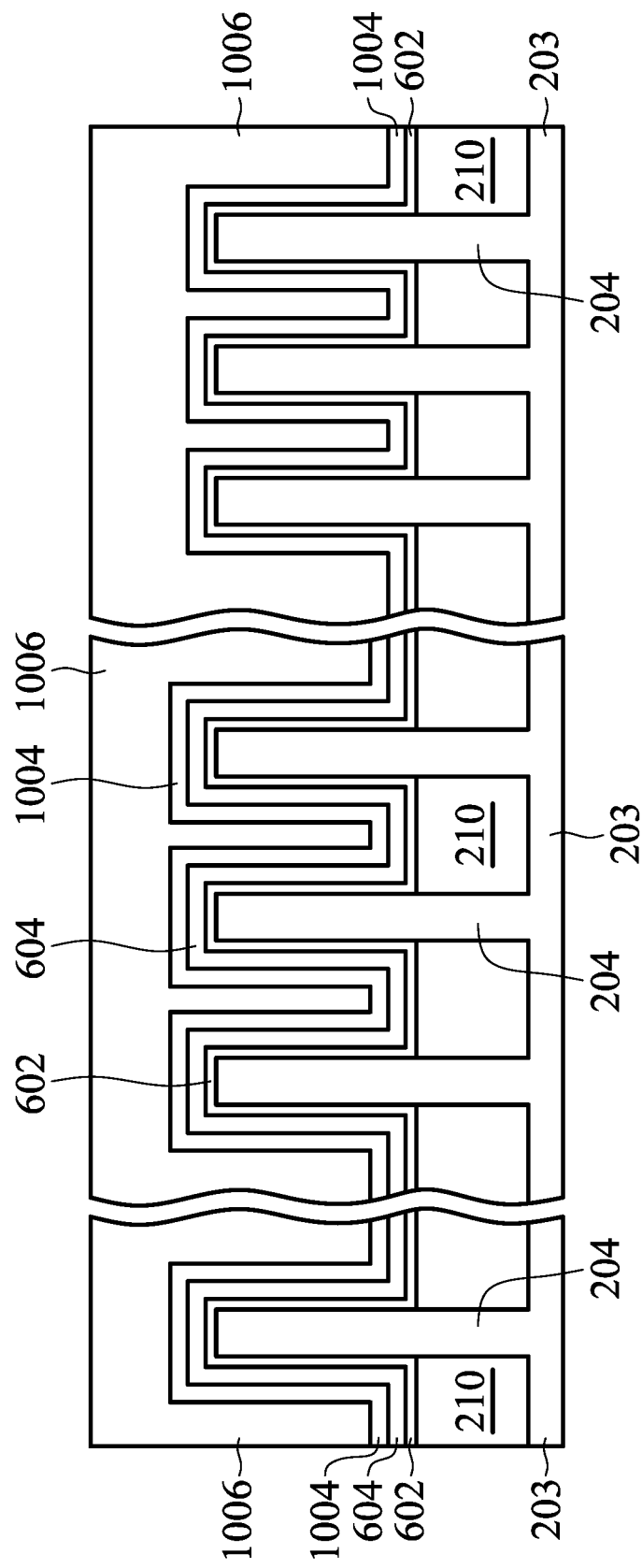

The method 100 then proceeds to block 118 where the dummy gate layer(s) are removed from the substrate. Referring to FIGS. 7A, 8A and 8B, the dummy gate layer 606 is removed from the gate stack 608. In some embodiments, the high-k gate dielectric layer 602 and the ferroelectric insulator layer 604 remain on the substrate 203. That is, the dummy gate layer 606 is selectively removed. The removal of the dummy gate layer 606 forms a trench 802 disposed over the ferroelectric insulator layer 604 and having sidewalls defined by the spacer elements 610. The gate replacement process may include etching, such as wet etching.

The method 100 then proceeds to block 120 where the ferroelectric insulator layer is patterned. It is noted in some embodiments, block 120 may occur prior to block 112. In some embodiments, a lithography process is used to pattern one or more layers to be disposed over certain transistors while exposing certain portions of the ferroelectric insulator layer 206. The portions of the ferroelectric insulator layer 206 that are exposed by the masking element formed may be part of gate stacks where the resultant FET does not operate as a negative capacitance FET. In some embodiments, a masking layer (e.g., photoresist and/or hard mask) is formed on the ILD layer 702 and over certain gate regions (e.g., 200' and 200") by a lithography process. In an embodiment, a low temperature plasma-enhanced CVD oxide layer is used as a hard mask. The masking layer includes openings that expose the remaining gate stacks having the ferroelectric insulator layer 206 to be removed (e.g., 200'''). Thereafter, the exposed ferroelectric insulator layer 206 is selectively removed by an etching process, such as a wet etch. Example etchants to remove the ferroelectric insulator layer 206 include suitable selective wet etching process such as sulfuric peroxide mix (SPM) that can selectively remove the ferroelectric insulator layer 604 with sufficient selectivity (e.g., little to no etching) of the high-k dielectric material 602. Referring to the example of FIGS. 9A and 9B, the ferroelectric insulator layer 206 has been removed from the gate stack for device 300''', while the ferroelectric insulator layer 206 remains on the gate stacks for devices 300' and 300''. Thus, an enlarged trench 902 is formed over the high-k dielectric layer 602 in the device 300'''. It is noted that the disclosure is not limited to removal of the ferroelectric insulator layer 206 on any specific FET beyond what is specifically captured in the claims. For example, as discussed below with reference to FIGS. 11A and 11B, the ferroelectric insulator layer 206 may be removed from other FETs formed on the substrate 203 as well.

The method 100 then proceeds to block 122 where a metal gate is formed over the fin. Referring to the example of FIGS. 10A and 10B, metal gate stacks 1002 are formed for each of transistors 200', 200'', and 200''' of the semiconductor structure 300. The gate stack 1002 is formed in the gate trench provided by the removal of the dummy gate layer 606 and/or the ferroelectric insulator layer 604, that is, in trenches 802 and 902 respectively. The metal gate stacks 1002 include a plurality of metal layers. The gate stack 1002 formed may be similarly comprised between each of transistors 200', 200'' and 200''' or the devices may include different materials. The formation of the gate stack 1002 includes deposition of one or more metal gate electrode layers. The deposition of one or more metal gate electrode layers may include deposition of one more metal containing layers followed by a CMP process. The gate stacks 1002 are formed on the substrate 203 overlying the channel region of the fin 204.

The gate stack 1002 includes the previously formed high-k gate dielectric layer 602 and, in some cases, the previously formed ferroelectric insulator layer 604. A gate electrode layer 1004 disposed over these insulating layer(s). The gate electrode layer 1004 may include metal or metal alloy. The gate electrode layer 1004 is illustrated as a single layer, but may include any number of layers that provide suitable work function, barrier layers, adhesion layers, capping layers, and the like. A fill metal layer 1006 is disposed over the gate electrode layer 1004. The gate electrode layer(s) 1004 may include Ti, Ag, Al, TiAlN, TaC, TaCN, TaSiN, Mn, Zr, TiN, TaN, Ru, Mo, Al, WN, Cu, W, or any suitable materials. The gate electrode layer(s) 1004 may be formed by suitable process such as ALD or PVD. In some embodiments, different metal materials are used for nFET and pFET devices with respective work functions. The choice of the WF metal depends on the FET to be formed on the active region. In some embodiments, the n-type WF metal included in the gate electrode layer 1004 includes tantalum (Ta). In other embodiments, the n-type WF metal included in the gate electrode layer 1004 includes titanium aluminum (TiAl), titanium aluminum nitride (TiAlN), or combinations thereof. In some embodiments, a p-type WF metal included in the gate electrode layer 1004 includes titanium nitride (TiN) or tantalum nitride (TaN). In other embodiments, the p-metal included in the gate electrode layer 1004 includes TiN, TaN, tungsten nitride (WN), titanium aluminum (TiAl), or combinations thereof. It is noted that the gate electrode layer(s) 1004 has a U-shaped structure as the gate electrode layer(s) are deposited into the trenches 802/902 lining the trench sidewalls.

As provided above, the fill metal layer 1006 is formed over the gate electrode layer(s) 1004. The fill metal layer 1006 may be formed by a suitable technique such as PVD or plating. Exemplary compositions of the fill metal layer 1006 include aluminum, tungsten, or other suitable metal. The fill metal layer 1006 may fill in the U-shaped profile provided by the gate electrode layer(s) 1004.

For the gate structures 1002 associated with transistors 200' and 200'' it is noted that the high-k dielectric layer 602 and the ferroelectric layer 604 do not extend up the sidewalls defined by the spacer elements 610—in other words, the high-k dielectric layer 602 and the ferroelectric layer 604 are not U-shaped.

The method 100 then proceeds to continuing processing of the semiconductor structure including, for example, forming interconnections to the devices. For example, contacts may be formed extending through the ILD layer 702 reaching the source region 212 and drain region 214 respectively. The contacts are conductive features electrically connecting to the source region 212 and drain region 214 to effectuate the respective transistor 200', 200'', or 200'''. The contacts may include a conductive plug of a conductive material (including metal and metal alloy), such as tungsten (W), aluminum (Al), aluminum alloy, copper (Cu), cobalt (Co), other suitable metal/metal alloy, or a combination thereof. Similarly, contacts are formed to each of the respective gate structures 1002 of transistors 200', 200", and 200'". One or more of the transistors 200', 200", or 200'" may be interconnected with one another through the contact and overlying multi-layer interconnect (MLI) structure. The MLI structure includes various conductive features to couple the various device features (such as the metal gate stacks 1002 and the source/drain features) to form a functional circuit of the semiconductor structure 300. Particularly, the MLI structure includes multiple metal layers to provide horizontal electrical routing and vias to provide vertical electrical routing. The metal lines may include W, Al, Cu, Co, or other suitable metal or metal alloy. The MLI structure also includes multiple ILD layers to isolate various conductive features from each other. The ILD layers may include low-k dielectric material or other suitable dielectric materials, such as silicon oxide.

Other fabrication operations may be implemented before, during and after the operations of the method 100. Some operations may be implemented by an alternative operation. Thus, provided in an embodiment of the method 100 is the semiconductor structure 300 including a first transistor 200', a second transistor 200", and a third transistor 200'". In some embodiments, the first transistor 200' having the ferroelectric insulator layer 604 interposing the gate electrode 1004 and the channel region in the fin 204 provides a negative capacitance FinFET device. In some embodiments, the second transistor 200" having the ferroelectric insulator layer 604 interposing the gate electrode 1004 and the channel region in the fin 204 provides a negative capacitance FinFET device. The second transistor 200" may be formed on relaxed (as compared to region 502) fin 204 pitch. In some embodiments, the third transistor 200'" having no ferroelectric insulator layer interposing the gate electrode 1004 and the channel region in the fin 204 provides standard FinFET device. The third transistor 200'" may be formed on tighten (as compared to region 402) fin 204 pitch. Having removed the ferroelectric insulator layer 604 spacing between the fins 204 at the tightened fins 204 is maintained. In some embodiments, this can improve the fill of conductive material between fins 204.

A voltage may be applied to the MLI and contact reaching the gate structures 1002 of transistors 200', 200", and/or 200'". The transistors 200' and 200" may be operated as negative capacitance FETs and may be coupled to transistor 200'" via the MLI, the transistor 200'" operating as a standard FET.

In another embodiment of the method 100 of FIG. 1, many of the same steps are presented as discussed above with the differences described below. First, in an embodiment, the device 200" formed in region 402 is a first I/O device and the device 200'" is a second I/O device. The I/O devices may be transistors of the semiconductor structure (e.g., IC) that operate to send signals to and from the semiconductor structure. The I/O devices are illustrated as device $200''_{IO}$ and $200'''_{IO}$ respectively in FIGS. 11A and 11B. Exemplary gate lengths for the device $200''_{IO}$ and $200'''_{IO}$ are between approximately 50 and 300 nanometers. In some embodiments, the pitch P1 of the region 402 including device $200''_{IO}$ is between approximately 22 and 32 nanometers. In some embodiments, the pitch P3 of the region 502 including device $200'''_{IO}$ is between approximately 20 and 26 nanometers. Further, as discussed above with reference to FIGS. 3, 4, and 5, the gate structures (e.g., defined by the dummy gate structures 608) may be formed at a consistent global pitch of between approximately 28 and 45 nanometers.

Figure 11A:
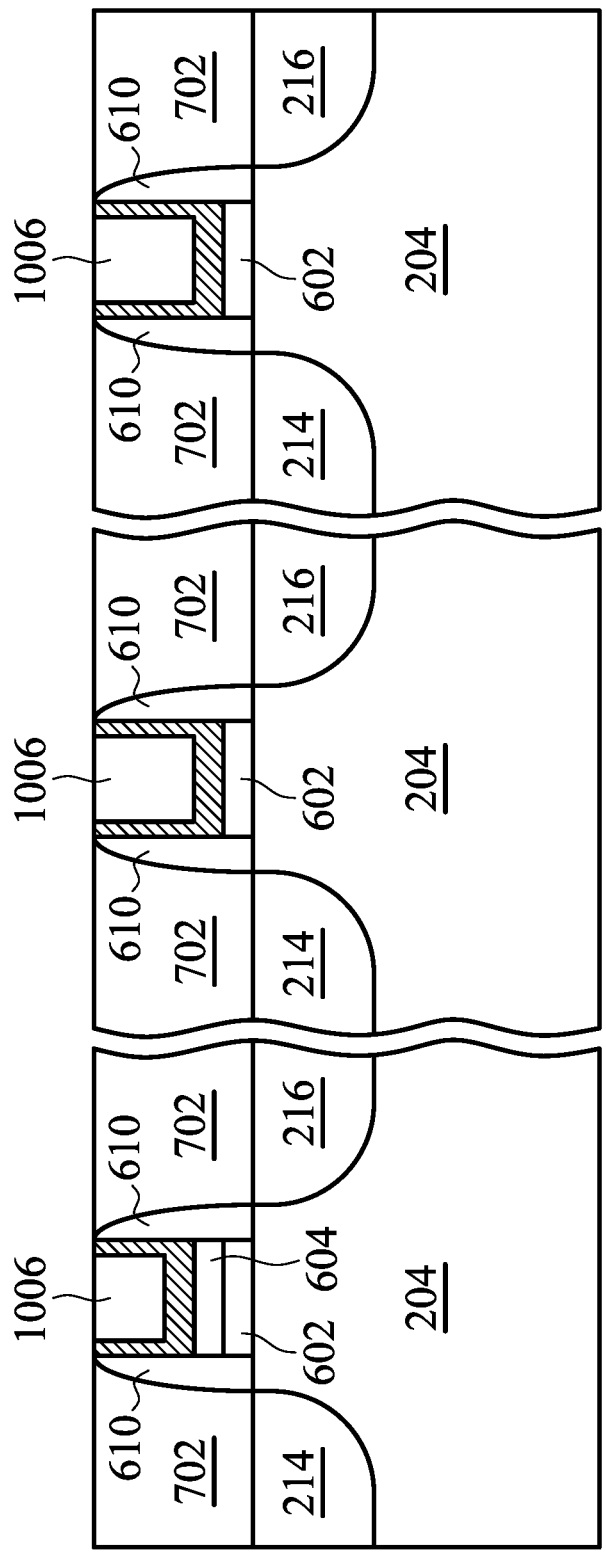
Figure 11B:
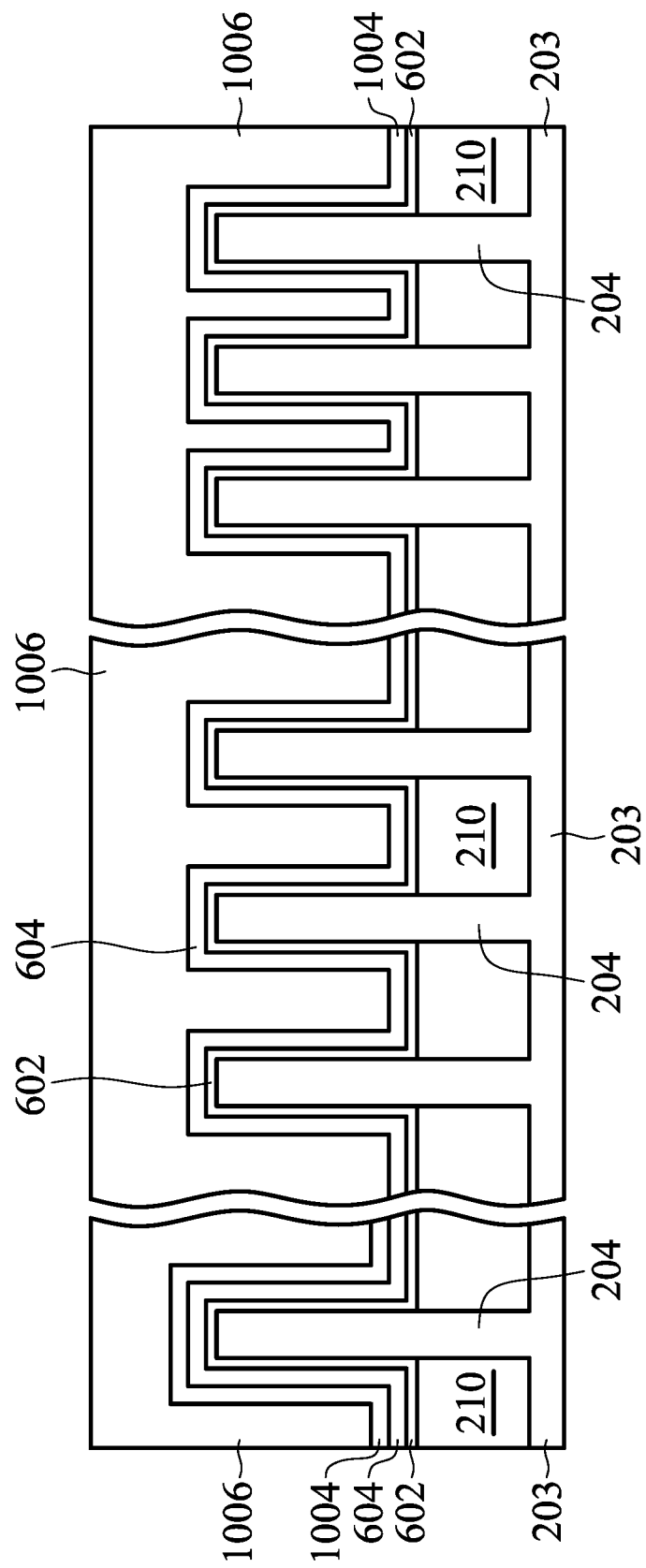

As illustrated in FIGS. 11A and 11B, the ferroelectric layer 206 has been removed from both the device $200''_{IO}$ and $200'''_{IO}$. That is, in the method 100 at block 120, suitable patterning is done to expose the ferroelectric layer at both of regions 402 and 502 of the substrate 103 for removal. Thereafter, the metal gate layer 1004 and 1006 is formed as discussed above. In some embodiments, the gate dielectric layer 602 is of a composition and thickness specifically designed for an I/O device functionality (e.g., thicker than that of a core device also disposed on the substrate 203).

It is understood that although the embodiments discussed above use the FinFET device 200 as an example for implementing the various aspects of the present disclosure, the various aspects of the present disclosure may be applicable to non-FinFET devices as well, for example to planar devices. In addition, the various aspects of the present disclosure are also applicable to multiple technologies (e.g., N45, N20, N16, N10, and beyond). Furthermore, the various aspects of the present disclosure are not necessarily limited to negative-capacitance applications. Further, it is understood that additional process steps may be performed before, during, or after the steps of the method 100 discussed above to complete the fabrication of the semiconductor device.

Figure 12:
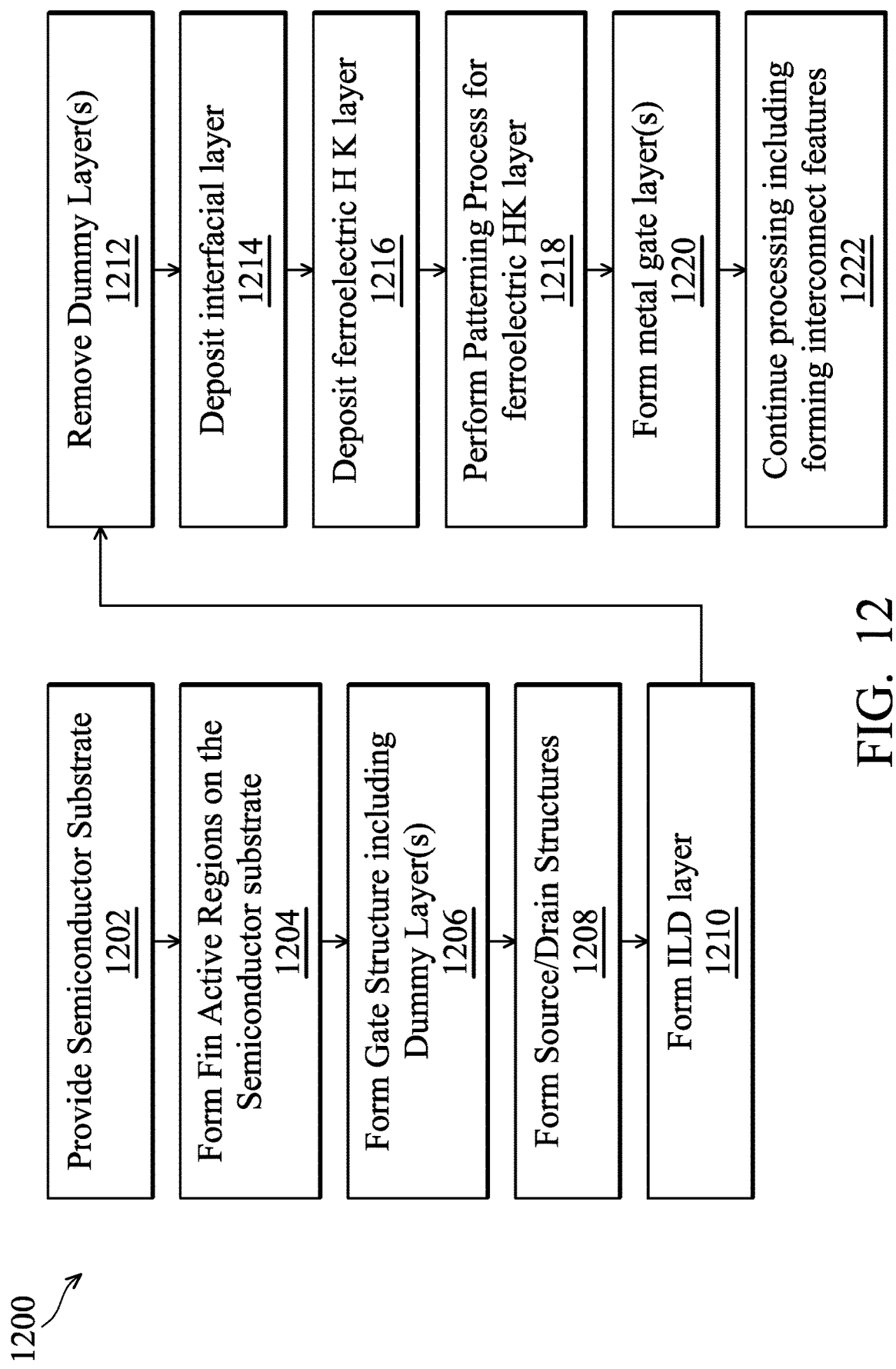
FIG. 12 is a flow chart illustrating another embodiment of a method of fabricating fin-based FETs according to various aspects of the present disclosure.

FIG. 12 is a flowchart of an embodiment of a method 1200 for fabricating a semiconductor structure having transistors constructed according to some embodiments of the present disclosure. FIGS. 14-22 are sectional views of a semiconductor structure 1400 (or portions thereof) at various fabrication stages. In the present embodiment, the semiconductor structure includes a plurality of fin transistors or FinFETs such as illustrated by the exemplary device 1400. In an embodiment, the device 1400 is a negative-capacitance fin-based field effect transistor (NC-FinFET). The semiconductor structure 1400 and the method 1200 making the same are collectively described below with reference to FIGS. 12 and 14-22. The perspective view of FIG. 2 and the top view of FIG. 3 also apply to the method 1200 and the device 1400.

In FIG. 12, a method 1200 of fabricating semiconductor structure providing an NC-FinFET is provided. For ease of understanding, FIGS. 14-22 illustrate diagrammatic fragmentary cross-sectional side views of the exemplary semiconductor structure 1400 at various stages of fabrication. The cross-sectional side views of FIGS. 14-22 are obtained by "cutting" the semiconductor structure along the X-direction illustrated in FinFET device 200 of FIGS. 2 and 3. The X-cut drawings are cut along a fin structure.

Figure 14:
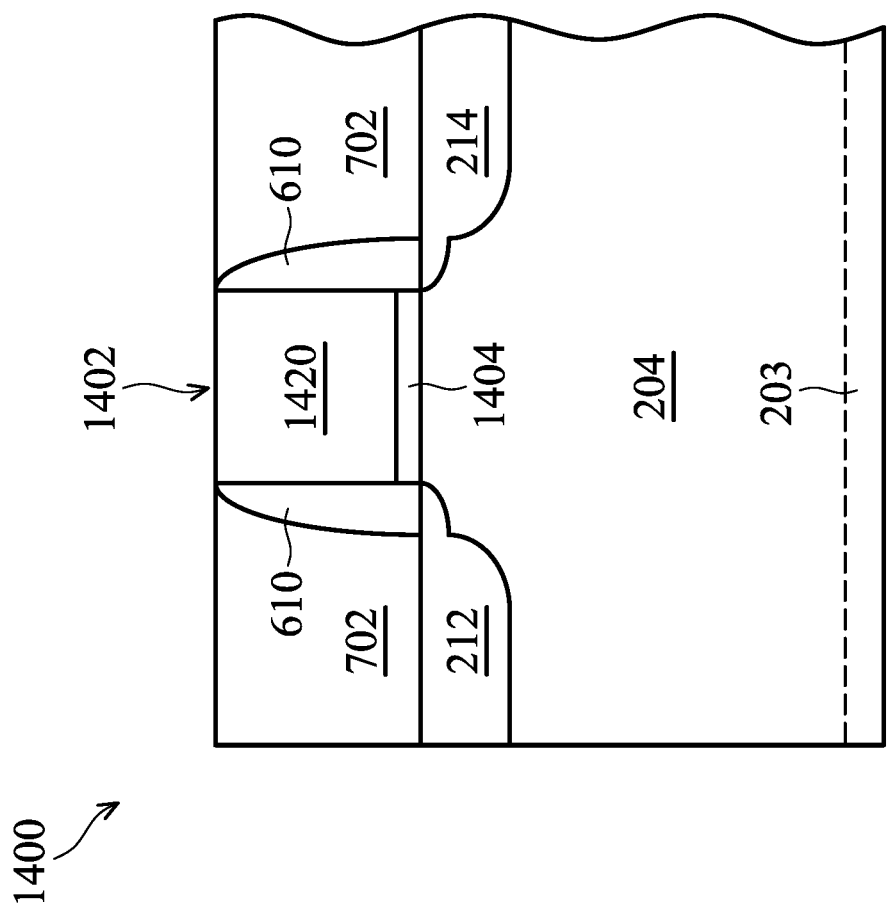
FIGS. 14, 15, 16, 17, 18, 19, 20, 21 and 22 are cross-sectional views of magnified portions of FinFET devices according to various embodiments of the present disclosure.

The method 1200 begins at block 1202 where a semiconductor substrate is provided. Referring to FIG. 14, the method 1200 begins with block 1202 by providing a semiconductor substrate 203.

In an embodiment, the semiconductor substrate 203 includes silicon. In some other embodiments, the substrate 203 includes germanium, silicon germanium or other proper semiconductor materials. The substrate 203 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor substrate 203 includes an epitaxy (or epi) semiconductor layer. In some embodiments, the substrate 203 may be a semiconductor on insulator, such as silicon on insulator (SOI).

The method 1200 then proceeds to block 1204 where fin active regions are formed on the semiconductor substrate. Still referring to the examples of FIG. 14, the method 100 proceeds to forming fins 204 on the semiconductor substrate 203. FIG. 14 illustrates a single device as exemplary. Typically a plurality devices can be formed including of various pitches as discussed above and/or devices that are negative capacitance FETs (NCFETs such as NCFinFETs) may be fabricated on the same substrate as MOSFET/FinFETs. Shallow trench isolation features such as STI feature 210 may interpose the fins 204 (not shown).

In some examples, the fin 204 is formed on the substrate 203 in a manner as discussed above with reference to the method 100.

The method 1200 then proceeds to block 1206 where a gate structure is formed on the substrate. The gate structure formed in block 1206 may include one or more dummy or sacrificial layers (referred to as dummy gate material) and thus be referred to as a dummy gate structure.

In an embodiment, the method 1200 includes forming a dummy gate dielectric layer and a dummy gate electrode. In an embodiment, the dummy gate dielectric layer includes silicon oxide or other suitable dielectric materials. In an embodiment, the dummy gate electrode includes a conductive material, such as polysilicon. In an embodiment, the dummy gate electrode is non-conductive. After deposition of the dummy gate material, the material is patterned to form a gate stack. The gate stack 1402 having the gate dielectric layer 1404 and the gate electrode 1406 is illustrated in FIG. 14. The gate stack 1402 is a dummy gate stack. As discussed above, in some embodiments, the gate dielectric layer 1404 and the gate electrode 1406 are sacrificial or dummy layers, which are subsequently replaced as discussed below.

In other embodiments, the method 1200 includes a gate-dielectric first process where the gate dielectric layer formed in block 1206 is maintained on the device. (In other words, the dielectric layer 1404 is maintained in the resultant FET.) In some embodiments, the dielectric layer 1404 includes a high-k dielectric material and in particular, in some embodiments includes a high-k ferroelectric insulator layer. In an embodiment, the dielectric layer 1404 is a high-k ferroelectric insulator layer such as the HK FE layer 1604, discussed below. The gate dielectric layer 1404 may further include an interfacial layer disposed between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The dielectric layer 1404 is deposited on the interfacial layer (if the interfacial layer is formed) by a suitable technique, such as ALD, CVD, metal-organic CVD (MOCVD), PVD, thermal oxidation, combinations thereof, and/or other suitable techniques.

Patterning the gate stack may be by photolithography processes similar to as discussed above with reference to the method 100. In some embodiments, a gate hard mask (not shown) may be formed on the gate stack—the gate electrode 1406 and the gate dielectric layer 1404—and the hard mask used as an etch mask during the formation of the gate stacks. The gate hard mask may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the gate stack 1402 includes forming a patterned resist layer on the hard mask by lithography process; etching the hard mask using the patterned resist layer as an etch mask; and etching the gate materials to form the gate stack 1402 using the patterned hard mask as an etch mask.

After the patterning of the gate electrode 1406 and dielectric layer 1404, one or more spacer elements 610 are formed on the sidewalls of the gate stacks 606. The gate spacers 610 may be used to offset the subsequently formed source/drain features and may be used for designing or modifying the source/drain structure profile. The gate spacers 610 are also used in the method 1200 to define a trench during the replacement gate process that removes the portions of the gate stack 1402, as discussed below. The gate spacers 610 may include any suitable dielectric material, such as a semiconductor oxide, a semiconductor nitride, a semiconductor carbide, a semiconductor oxynitride, other suitable dielectric materials, and/or combinations thereof. The gate spacers 610 may have multiple films, such as two films (a silicon oxide film and a silicon nitride film) or three films (a silicon oxide film; a silicon nitride film; and a silicon oxide film). The formation of the gate spacers 610 includes deposition and anisotropic etching, such as dry etching.

The method 1200 then proceeds to block 1208 where source/drain regions are formed on/over the fins. Referring to FIG. 14, the semiconductor structure 1400 is illustrated with source feature 212 and drain feature 214 adjacent the gate stack 1402. Each field effect transistor includes source and drain features 212, 214 formed on the respective fin 204 active region and interposed by the gate stack 1402. A channel is formed in the fin 204 active region in a portion that is underlying the gate stack 1402 and spans between the source and drain features. The gate length, as well as Lov, is defined by the distance of the channel between the source and drain features. The source features 212 and the drain features 214 may include both light doped drain (LDD) features and heavily doped source and drain (S/D). In some embodiments, the source features 212 and the drain features 214 are formed by epitaxially growing source/drain material on the fins 204. In some embodiments, the source features 212 and the drain features 214 are formed by etching a trench in the fin 204 and epitaxially growing portions of the source features 212 and the drain features 214 in and over the trench.

In that affect, raised source/drain features 212/214 may be formed by selective epitaxy growth for strain effect with enhanced carrier mobility and device performance. The gate stack 1402 and gate spacer 610 constrain the source/drain features 212/214 to the source/drain regions. In some embodiments, the source/drain features 212/214 are formed by one or more epitaxy or epitaxial (epi) processes, whereby Si features, SiGe features, SiC features, and/or other suitable features are grown in a crystalline state on, over or in the fins 204. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin 204.

The source/drain regions 212/214 may also be N-type doped or P-type doped, depending on whether the FinFET device 200 is a PFET or an NFET. For N-type doped source/drain regions 212/214, they may include, as examples, SiP, SiAs, SiGeP, SiGeAs, GeP, GeAs, or other SiGeSn III-V group compounds. For P-type doped source/drain regions 212/214, they may include, as examples, SiB, SiGa, SiGeB, SiGeGa, GeB, GeGa, or other SiGeSn III-V group compounds.

The method 1200 then proceeds to block 1212 where additional dielectric layer(s) are formed adjacent the gate stack. In some embodiments, the dielectric layer(s) includes an interlayer dielectric (ILD) layer. Referring still to FIG. 14, an inter-level dielectric material (ILD) layer 702 is formed on the substrate 203. The ILD layer 702 surrounds the gate stack 1402 and the gate spacers 610. The ILD layer 702 allows portions of the gate stack 1402 to be removed and a replacement gate to be formed in the resulting cavity (also referred to as gate trench) as discussed below. The ILD layer 702 also acts as an insulator that supports and isolates the conductive features (e.g., contacts) later formed to contact the respective FET features including source/drain regions 212/214. The ILD layer 702 may include any suitable dielectric material, such as a semiconductor oxide, a semiconductor nitride, a semiconductor oxynitride, low-k dielectric materials, other suitable dielectric materials, or combinations thereof. In some embodiments, the formation of the ILD layer 702 includes suitable deposition and a planarization process (e.g., CMP) to provide a planarized top surface exposing the top surface of gate stack 1402.

Figure 15:
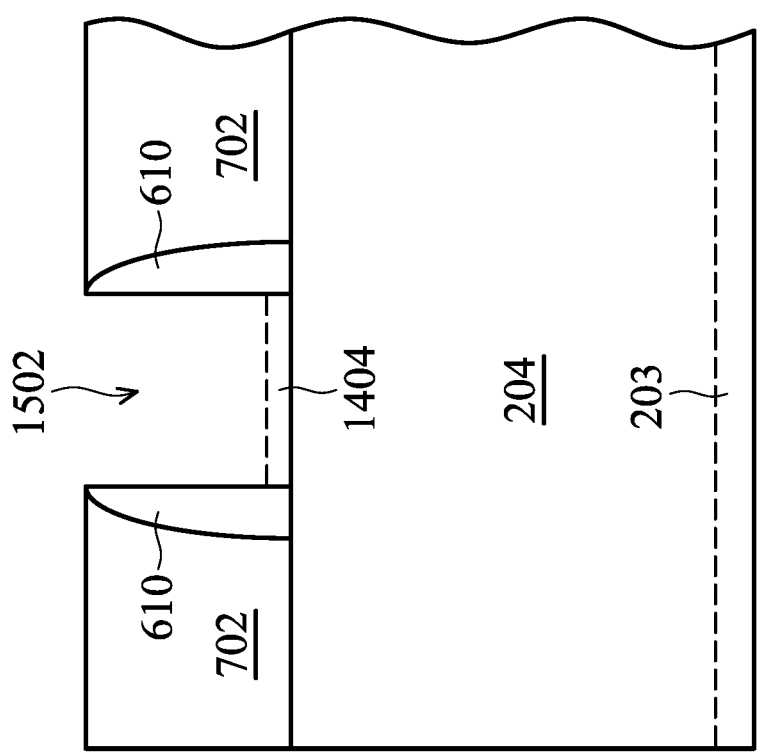

The method 1200 then proceeds to block 1212 where dummy layer(s) of the gate stack 1402 are removed from the substrate. Referring to FIG. 15, the gate stack 1402 is removed including the gate dielectric layer 1404 and the gate electrode layer 1406 to form the trench 1502. In some other embodiments, the gate dielectric layer 1404 remains on the substrate 203 and the trench formed is defined by a bottom surface of the gate dielectric layer. In such an embodiment, the gate dielectric layer 1404 may be substantially similar to the HK FE layer 1604 discussed below. The gate stack removal process may include etching, such as wet etching.

In some embodiments, the method 1200 then proceeds to block 1214 where an interfacial layer 1602 is formed on the exposed surface of the trench 1502. The interfacial layer 1602 is a dielectric layer and contributes to the equivalent oxide thickness (EOT) of the resultant device. The interfacial layer 1602 may include silicon oxide, silicon nitride, silicon oxynitride, and/or other suitable material. The interfacial layer is deposited by a suitable method, such as ALD, CVD, ozone oxidation, thermal oxidation, etc. In some embodiments, the interfacial layer 1602 is formed by an oxide growth process such as, during an anneal process. In an embodiment, the interfacial layer 1602 is approximately 10 Angstroms (A) to approximately 50 A. However, other thicknesses are possible as resultant from the fabrication processes, device performance, and/or desired for the EOT of the resultant device.

In some embodiments, the interfacial layer 1602 is part of the dielectric layer 1404 and is maintained on the device (in other words, the removal of block 1212 is limited to the gate electrode layer 1406).

In some embodiments, the method 1200 then proceeds to block 1216 where a ferroelectric high-k dielectric layer is formed in the trench provided by removal of the dummy gate stack or portion thereof.

Figure 16:
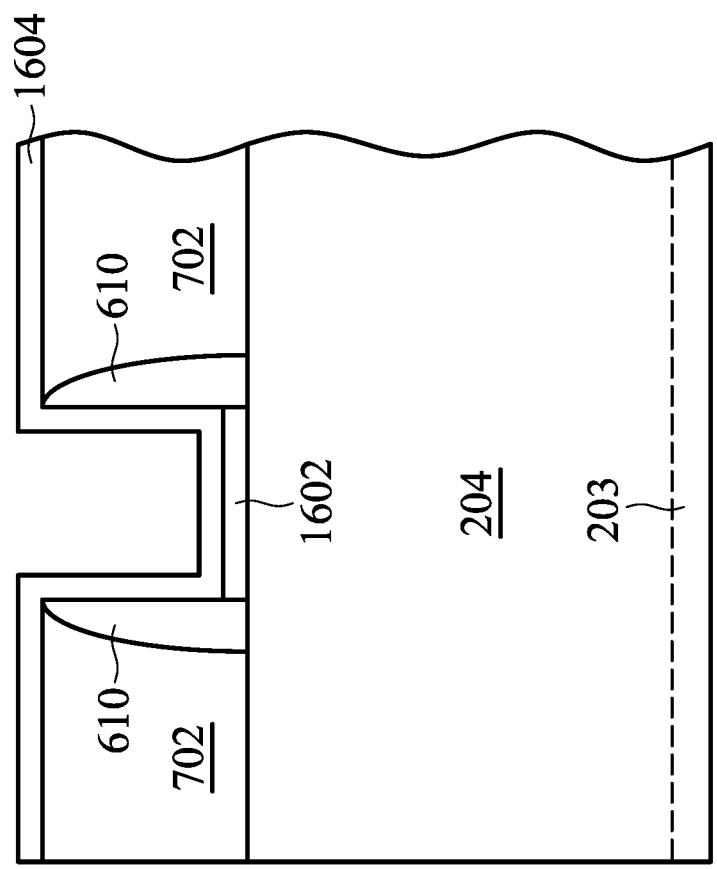

Referring to the example of FIG. 16, a ferroelectric insulator layer 1604 may be formed on the substrate 203 including over the fin 204. In some embodiments, the ferroelectric insulator layer 1604 includes a high-k (HK) dielectric material having ferroelectric properties. As such, the ferroelectric insulator layer 1604 may also be referred to as a HK FE layer. The ferroelectric insulator layer 1604 may include HfZrO2, HfAlO2, PbZrTiO3 (or PZT), SrTiO3, BaTiO3, combinations thereof, or other suitable materials providing high polarizability. The ferroelectric insulator (HK FE) layer 1604 may be formed directly on the interfacial layer 1602. In some embodiments, another high-k dielectric layer may interpose the interfacial layer 1602 and the HK FE layer 1604. The ferroelectric insulator (HK FE) layer 1604 may be deposited by a suitable technique, such as ALD, CVD, metal-organic CVD (MOCVD), PVD, combinations thereof, and/or other suitable techniques. The ferroelectric insulator (HK FE) layer 1604 may be deposited as a blanket layer and subsequently patterned, such as discussed below. In an embodiment, the ferroelectric insulator (HK FE) layer 1604 has a thickness between approximately 10 A and approximately 80 A. In a further embodiment, the thickness of the ferroelectric insulator layer 1604 is approximately 15 A. The thickness of the ferroelectric insulator layer 1604 may be selected to provide suitable performance of the NCFET (e.g., determining the coupling of the gate electrode and substrate). It is note that as the HK FE layer 1604 is subsequently removed from the sidewalls, in some embodiments, the effect of the capacitance on the sidewalls is reduced and difficulties in maintaining a sufficient opening for depositing subsequent metal gate layers (discussed below) are reduced. The composition of the ferroelectric insulator (HK FE) layer may be important to provide the nonlinear capacitance of the NC-FET providing a negative change in polarizability for a change in voltage applied to the gate. The thickness of the ferroelectric insulator layer 1604 may also be important to the resulting FET performance. As the ferroelectric layer 1604 increases in thickness, the layer's capacitance decreases; in operation in the NC-FET this means that more negative voltage drop across the ferroelectric layer and thus, the increase of positive voltage and Ids. Further, a sufficient thickness of ferroelectric insulator layer 1604 is needed such that crystallization of the layer occurs and it achieves suitable ferroelectric performance.

In the cases where a high-k dielectric layer is also included in the device 1400, the high-k dielectric layer may be substantially similar to the high-k dielectric layer 602 discussed above with reference to the method 100 and may similarly be configured with respect to the ferroelectric layer 1604 as discussed with respect to the ferroelectric insulator layer 604 above.

Figure 17:
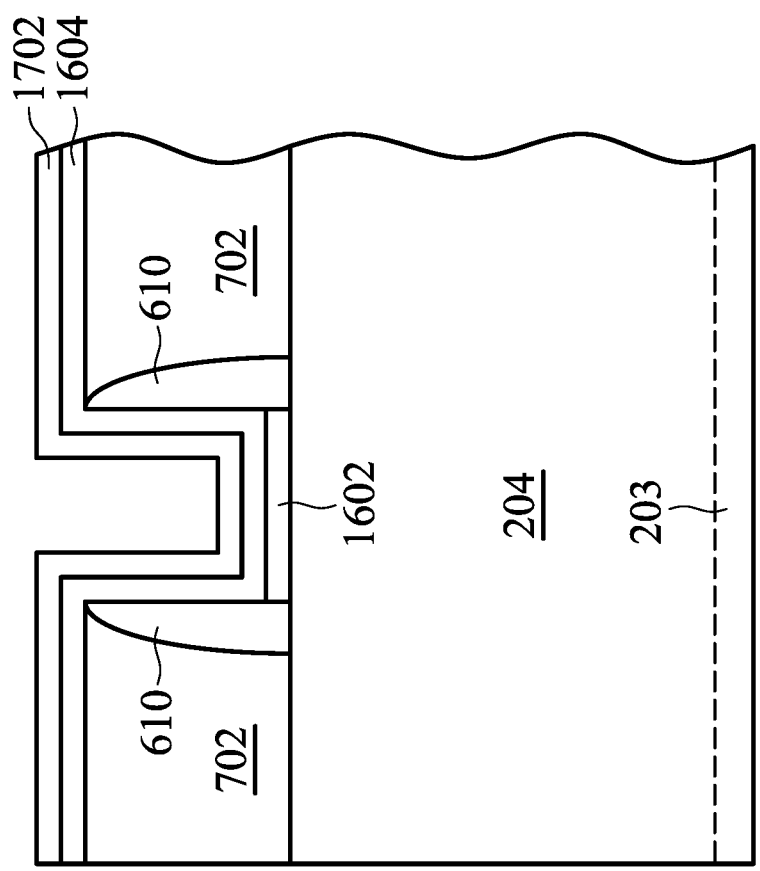
Figure 20:
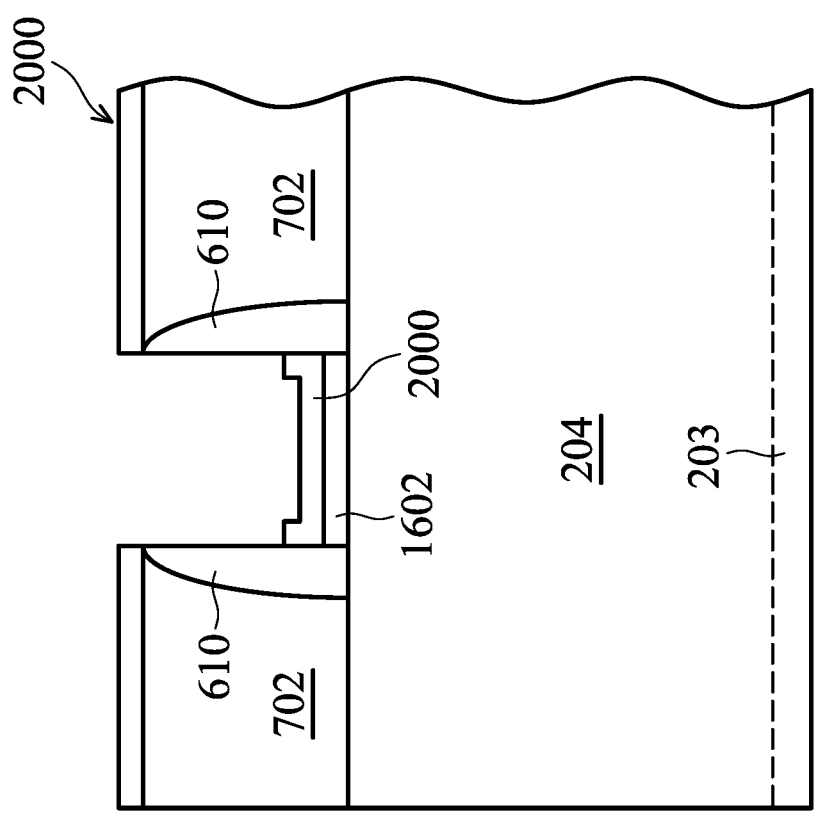
Figure 21:
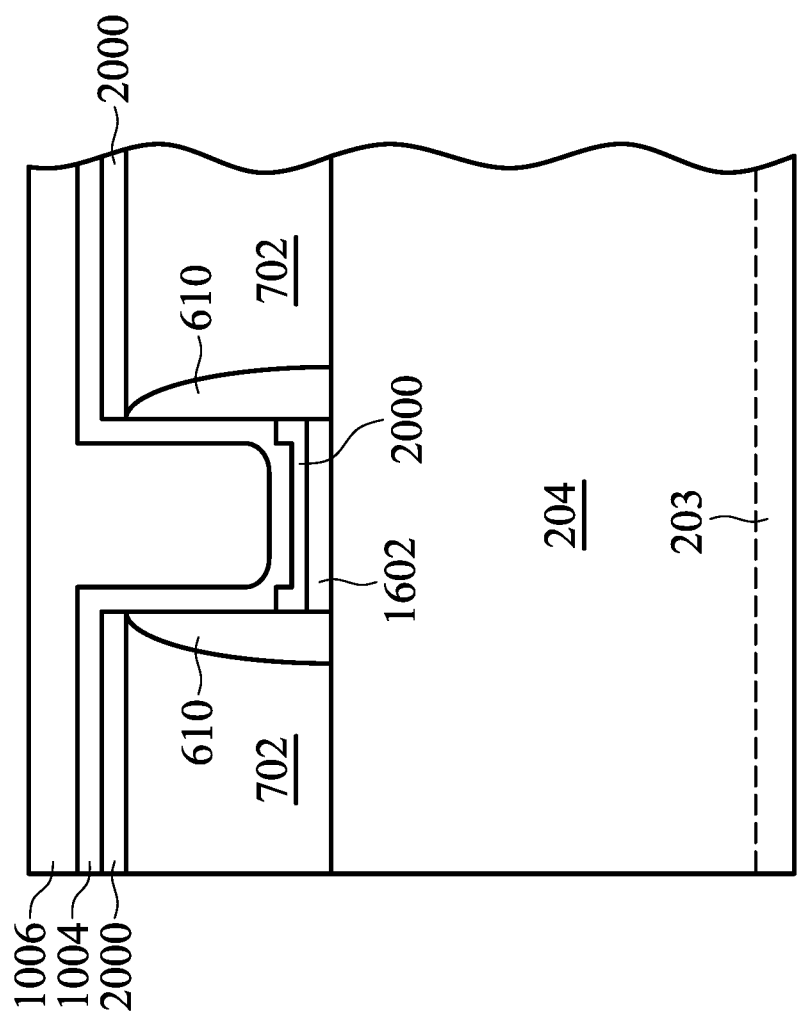
Figure 22:
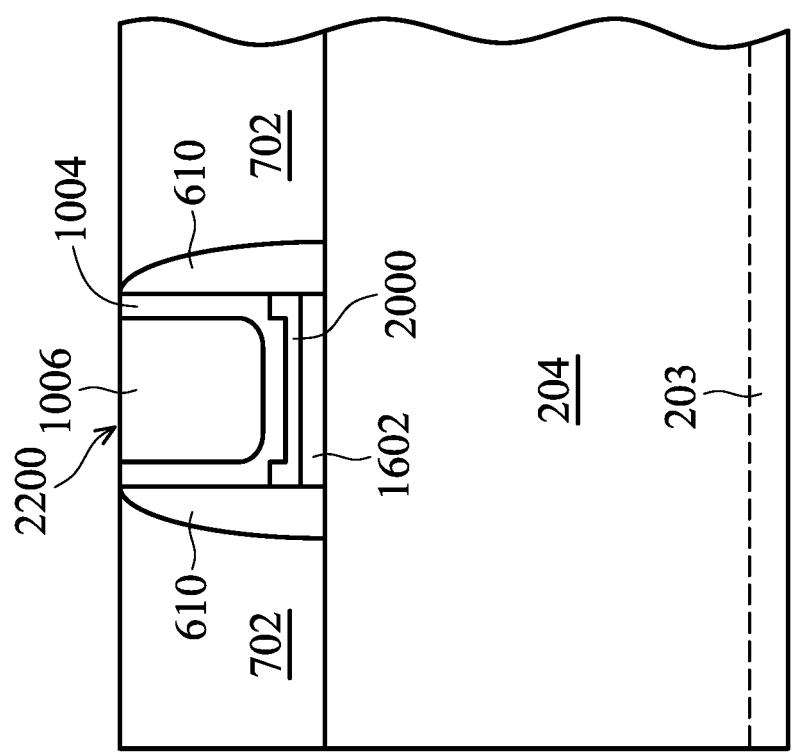

The method 1200 then proceeds to block 120 where the ferroelectric insulator layer is patterned. Using the example of FIG. 16, the HK FE layer 1604 is patterned to provide the patterned HK FE layer 2000 (FIG. 20). The patterning of the ferroelectric insulator layer may include a plurality of processing steps including fabricating a masking element that protects a region of the ferroelectric layer adjacent the channel region of the fin 204, while exposing the HK FE layer on the sidewalls of the trench. In some embodiments, the masking element is formed by depositing an amorphous silicon layer, doping the layer, selectively removing the doped portion of the layer, and using the undoped portions as a mask when etching the ferroelectric insulator layer. This is discussed in further detail below. As illustrated in FIG. 17, a layer 1702 is deposited in the trench 1502 over the HK FE layer 1604. In an embodiment, the layer is amorphous silicon (A-Si).

Figure 18:
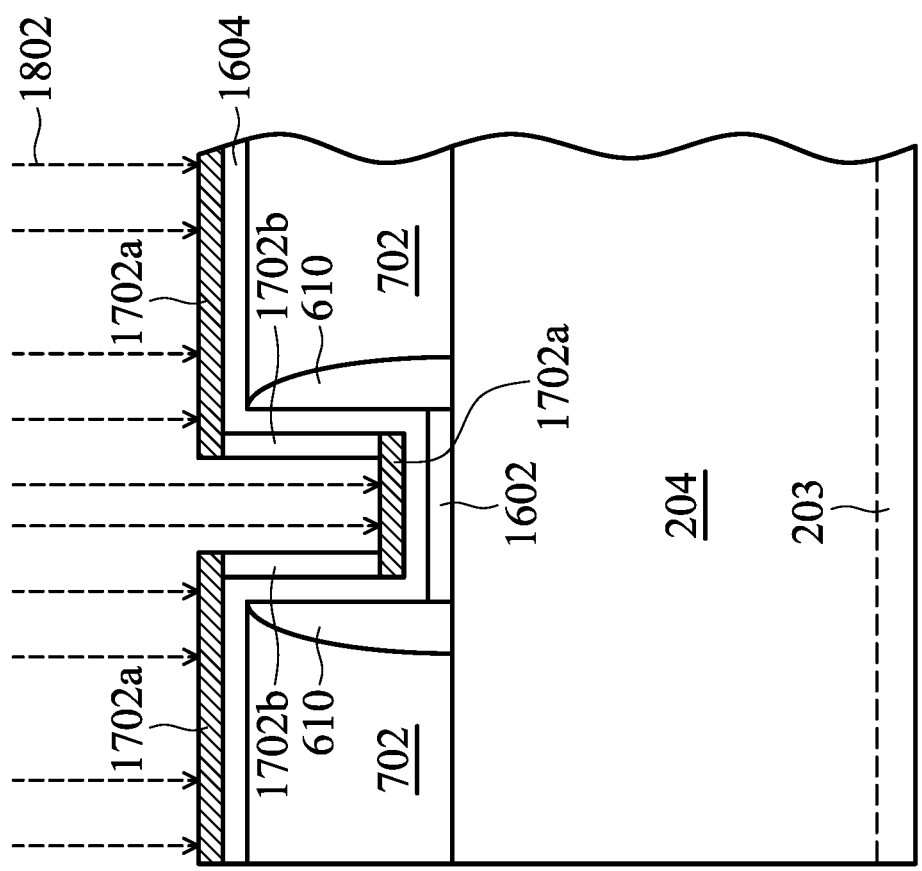
Figure 19:
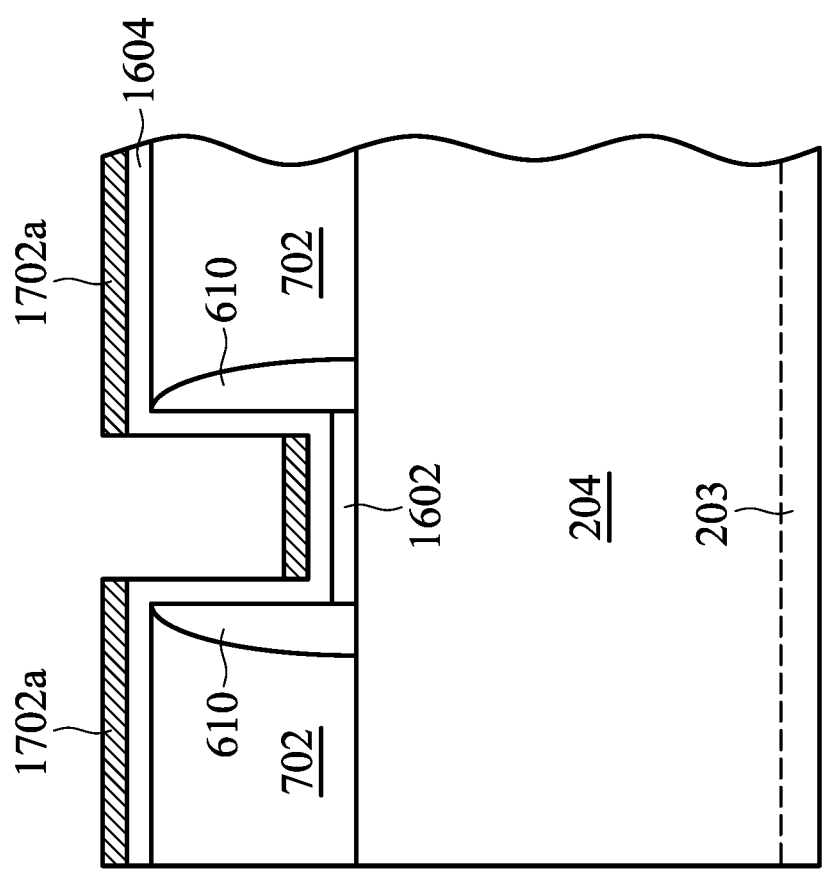

Next, as illustrated in FIG. 18, an implantation process 1802 is performed on the layer 1702. The implantation process 1802 may be a vertical implant. A vertical implant may provide the dopants at a direction substantially perpendicular a top surface of the substrate 203. In an embodiment, the implantation process implants boron atoms into the layer 1702. The implantation may partially harden the layer 1702 in the implanted regions (e.g., harden the a-Si). As illustrated in FIG. 18, the implantation 1802 forms implanted regions 1702*a* of the layer 1702 and non-implanted regions 1702*b* of the layer 1702. (It is noted that the non-implanted regions 1702*b* are not purposefully implanted but may include a trace dopant amount within the range that still provides selectivity between regions 1702*a* and 1702*b* when etching as discussed below.)

The patterning process then continues to remove portions of the layer 1702, specifically, to removing the non-implanted regions 1702*b* selectively. The selective removal of regions 1702*b* may be performed by a wet etch such as a wet etch including the etchant $NH_3OH$. The selective removal of regions 1702*b* is illustrated in the interim device illustrated in FIG. 19. The remaining regions 1702*a* provide a masking element for the subsequent patterning of the HK FE layer 1604 discussed below.

While using the regions 1702*a* as a masking element, exposed portions of the FE HK layer 1604 are etched to form patterned FE HK layer 2000, as illustrated in FIG. 20. Specifically, the patterned FE HK layer 2000 includes a bottom portion that has a saddle-shape, extending only slightly up the sidewalls of the trench 1502. The FE HK layer 2000 may be etched by suitable selective wet etching process such as sulfuric peroxide mix (SPM).

In an embodiment, after patterning the FE HK layer, the implanted regions 1702*a* are removed by a suitable etchant. Exemplary etchants include $H_3PO_4$.

The method 1200 then proceeds to block 1220 where a metal gate is formed over the fin. Referring to the example of FIG. 21, metal gate stack 2200 is formed over the semiconductor structure 1400. The metal gate stack 2200 is formed in the gate trench provided by the removal of the gate stack 1402 and the patterning of the FE HK layer 2000. The metal gate stack 2200 includes a plurality of metal layers. The formation of the gate stack 2200 includes deposition of one or more metal gate electrode layers. The gate stack 2200 is formed on the substrate 203 overlying the channel region of the fin 204.

The gate stack 2200 includes the patterned HK FE layer 2000 and the IL layer 1602. Further, a gate electrode layer 1004 is disposed over these insulating layer(s). The gate electrode layer 1004 may include metal or metal alloy. The gate electrode layer 1004 is illustrated as a single layer, but may include any number of layers that provide suitable work function, barrier layers, adhesion layers, capping layers, and the like. A fill metal layer 1006 is disposed over the gate electrode layer 1004. The gate electrode layer(s) 1004 may include Ti, Ag, Al, TiAlN, TaC, TaCN, TaSiN, Mn, Zr, TiN, TaN, Ru, Mo, Al, WN, Cu, W, or any suitable materials. The gate electrode layer(s) 1004 may be formed by suitable process such as ALD or PVD. In some embodiments, different metal materials are used for nFET and pFET devices with respective work functions. The choice of the WF metal depends on the FET to be formed on the active region. In some embodiments, the n-type WF metal included in the gate electrode layer 1004 includes tantalum (Ta). In other embodiments, the n-type WF metal included in the gate electrode layer 1004 includes titanium aluminum (TiAl), titanium aluminum nitride (TiAlN), or combinations thereof. In some embodiments, a p-type WF metal included in the gate electrode layer 1004 includes titanium nitride (TiN) or tantalum nitride (TaN). In other embodiments, the p-metal included in the gate electrode layer 1004 includes TiN, TaN, tungsten nitride (WN), titanium aluminum (TiAl), or combinations thereof.

As provided above, the fill metal layer 1006 is formed over the gate electrode layer(s) 1004. The fill metal layer 1006 may be formed by a suitable technique such as PVD or plating. Exemplary compositions of the fill metal layer 1006 include aluminum, tungsten, or other suitable metal.

The deposition of one or more metal gate electrode layers may include deposition of one more metal containing layers followed by a CMP process. The CMP process may remove the residual FE HK layer 2000 disposed on a top surface of the ILD layer 702.

Provided from the deposition of the gate electrode layers 1004 and 1006, the gate structure 2200 is formed. For the gate structures 2200 it is noted that the ferroelectric layer 2000 does not extend up the sidewalls defined by the spacer elements 610—in other words, the ferroelectric layer 2000 is not U-shaped but saddle-shaped. In an embodiment, the metal gate materials are formed directly on ferroelectric layer 2000 having the saddle-shape. For example, a work function material of the gate electrode layer 1004 may be disposed within the opening of the saddle-shape.

The method 1200 then proceeds to continuing processing of the semiconductor structure including, for example, forming interconnections to the devices. For example, contacts may be formed extending through the ILD layer 702 reaching the source region 212 and drain region 214 respectively. The contacts are conductive features electrically connecting to the source region 212 and drain region 214 to effectuate the respective transistor. The contacts may include a conductive plug of a conductive material (including metal and metal alloy), such as tungsten (W), aluminum (Al), aluminum alloy, copper (Cu), cobalt (Co), other suitable metal/metal alloy, or a combination thereof. Similarly, contacts are formed the respective gate structure 2200. The resulting transistor may be interconnected with the contact and overlying multi-layer interconnect (MLI) structure. The MLI structure includes various conductive features to couple the various device features (such as the metal gate stacks 2200 and the source/drain features) to form a functional circuit including the semiconductor device 1400. Particularly, the MLI structure includes multiple metal layers to provide horizontal electrical routing and vias to provide vertical electrical routing. The metal lines may include W, Al, Cu, Co, or other suitable metal or metal alloy. The MLI structure also includes multiple ILD layers to isolate various conductive features from each other. The ILD layers may include low-k dielectric material or other suitable dielectric materials, such as silicon oxide.

Other fabrication operations may be implemented before, during and after the operations of the method 1200. Some operations may be implemented by an alternative operation.

It is understood that although the embodiments discussed above use the device 1400 as an example for implementing the various aspects of the present disclosure, the various aspects of the present disclosure may be applicable to non-FinFET devices as well, for example to planar devices. In addition, the various aspects of the present disclosure are also applicable to multiple technologies (e.g., N45, N20, N16, N10, and beyond). Furthermore, the various aspects of the present disclosure are not necessarily limited to negative-capacitance applications. Further, it is understood that additional process steps may be performed before, during, or after the steps of the method 1200 discussed above to complete the fabrication of the semiconductor device.

Based on the above discussions, it can be seen that the present disclosure offers advantages for fabrication of negative-capacitance FinFETs and the semiconductor structures that include the NC-FinFET devices. It is understood, however, that other embodiments may offer additional advantages, and not all advantages are necessarily disclosed herein, and that no particular advantage is required for all embodiments.

Advantages of some embodiments include removal of the ferroelectric material for certain devices including those with a relatively tighter pitch of fin elements. The tighter pitch fin elements decreases the available space between adjacent fins in which to form the gate structure. With the removal of the ferroelectric layer, additional space is reclaimed for other layers (e.g., metal gate layers) of those devices. Thus, filling between adjacent fins without forming voids is more easily achieved. At the same time, sufficient thickness of the ferroelectric layer for other devices on the substrate can be maintained by the methods discussed above.

One embodiment of the present disclosure a method of fabricating semiconductor device including a negative capacitance field effect transistor is presented. The method includes providing a substrate having a first fin and a second fin extending therefrom. A high-k gate dielectric layer and a ferroelectric insulator layer are deposited over the first fin and the second fin. A dummy gate layer is deposited over the ferroelectric insulator layer over the first fin and the second fin to form a first gate stack over the first fin and a second gate stack over the second fin. The dummy gate layer of the first gate stack is removed (while maintaining the ferroelectric insulator layer) to form a first trench. And the dummy gate layer and the ferroelectric insulator layer of the second gate stack are removed to form a second trench. At least one metal gate layer is formed in the first trench and the second trench.

In another embodiment presented, a method of fabricating semiconductor structure includes providing a substrate having a first plurality of fins at a first pitch and a second plurality of fins at a second pitch. A first gate stack including a high-k gate dielectric layer, a ferroelectric insulator layer, and a dummy gate layer is formed over the first plurality of fins. A second gate stack including the high-k gate dielectric layer, the ferroelectric insulator layer, and the dummy gate layer is formed over the second plurality of fins. The dummy gate layer of the first gate stack is removed to form a first trench. The dummy gate layer and the ferroelectric insulator layer of the second gate stack are removed to form a second trench. A U-shaped metal layer is formed in each of the first trench and the second trench.

In another embodiment, a device is provided including a fin extending from a semiconductor substrate and a gate structure disposed over the fin and having a spacer element on a sidewall of the gate structure. The gate structure includes each of a high-k dielectric layer disposed over the fin and abutting the spacer element from a bottom interface to a first point, a ferroelectric insulator layer over the high-k dielectric layer and abutting the spacer element from the first point to a second point, and a work function gate layer abutting the spacer element from the second point to a third point above the second point.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor device including a negative capacitance field effect transistor, comprising:
   providing a substrate having a first fin and a second fin extending therefrom;
   depositing a high-k gate dielectric layer over each of the first fin and the second fin;
   depositing a ferroelectric insulator layer over the high-k gate dielectric layer over each of the first fin and the second fin;
   depositing a dummy gate layer over the ferroelectric insulator layer over the first fin and the second fin to form a first gate stack including the high-k gate dielectric layer, the ferroelectric insulator layer, and the dummy gate layer over the first fin and a second gate stack including the high-k gate dielectric layer, the ferroelectric insulator layer, and the dummy gate layer over the second fin;
   concurrently removing the dummy gate layer from the first gate stack and the second gate stack, wherein during the concurrently removing the dummy gate layer the ferroelectric insulator layer of the first gate stack is maintained to form a first trench above the ferroelectric insulator layer and the ferroelectric insulator layer of the second gate stack is removed with the dummy gate layer to form a second trench above the high-k gate dielectric layer; and
   forming at least one metal gate layer within the first trench over the ferroelectric insulator layer and within the second trench.

2. The method of claim 1, wherein the first gate stack extends over a third fin and the second gate stack extends over a fourth fin.

3. The method of claim 2, wherein the first fin and the third fin have a first pitch and the second fin and the fourth fin have a second pitch, the second pitch less than the first pitch.

4. The method of claim 1 wherein the depositing the high-k gate dielectric layer includes forming a HfO2 layer.

5. The method of claim 4, wherein the depositing the ferroelectric insulator layer includes forming at least one of a HfZrO2 layer and a HfAlO2 layer.

6. The method of claim 1, further comprising:
   forming a first spacer element on a first sidewall of the first gate stack and a second spacer element on a second sidewall of the first gate stack, and
   forming a third spacer element on a first sidewall of the second gate stack and a fourth spacer element on a second sidewall of the second gate stack,
   wherein the first trench is defined as a space between the first and second spacer elements and the second trench is defined as a space between the third and fourth spacer elements.

7. The method of claim 1, wherein the depositing the dummy gate layer includes depositing polysilicon directly on ferroelectric insulator layer.

8. The method of claim 1, wherein the depositing the high-k gate dielectric layer and the ferroelectric insulator layer include depositing blanket layers of each of a high-k gate dielectric material and a ferroelectric insulator material and patterning the deposited blanket layers.

9. The method of claim 1, wherein forming at least one metal gate layer includes depositing a fill metal layer.

10. The method of claim 1, wherein a thickness of the ferroelectric insulator layer is between approximately 2 and 5 nanometers.

11. A method of fabricating semiconductor structure, comprising:
   forming a trench disposed over a fin structure, wherein trench sidewalls are defined by dielectric material;
   disposing a high-k ferroelectric (HK FE) layer on the trench sidewalls and a bottom of the trench;
   forming a conformal layer over the HK FE layer;
   performing a vertical implantation process to implant a first portion of the conformal layer, wherein a second portion of the conformal layer is not intentionally implanted during the implanting the first portion of the conformal layer;
   after performing the vertical implantation process, removing the second portion of conformal layer;
   patterning the HK FE layer while using the implanted first portion of the conformal layer as a masking element to define the patterning the HK FE layer; and
   after the patterning, depositing a metal gate layer over the patterned HK FE layer.

12. The method of claim 11, wherein the conformal layer is amorphous silicon.

13. The method of claim 11, wherein the vertical implantation process include implanting boron.

14. The method of claim 11 wherein the patterning the HK FE layer forms a saddle-shaped HK FE layer.

15. The method of claim 11, wherein the depositing the metal gate layer over the patterned HK FE layer includes forming a metal layer directly on the trench sidewalls of dielectric material.

16. The method of claim 11, further comprising:
   forming a dummy gate structure; and
   removing a dummy gate electrode layer of the dummy gate structure to form the trench before forming the conformal layer.

17. A device, comprising:
   a fin extending from a semiconductor substrate; and
   a gate structure disposed over the fin and having a first spacer element on a first sidewall of the gate structure and a second spacer element on a second sidewall of the gate structure, wherein the gate structure includes:
      a high-k dielectric layer disposed over the fin and abutting each of the first spacer element and the second spacer element from a bottom interface to a first point on each of the first spacer element and the second spacer element;
      a ferroelectric insulator layer over the high-k dielectric layer, wherein the ferroelectric insulator layer has a U-shape defined by a bottom portion, a first side portion extending above the bottom portion, and a second side portion extending above the bottom portion, and wherein the ferroelectric insulator layer abuts each of the first spacer element and the second spacer element from the first point to a second point, the second point above the first point; and
      a work function gate layer disposed between the first side portion and the second side portion and abutting each of the first spacer element and the second spacer element from the second point to a third point above the second point.

18. The device of claim 17, wherein the third point is a top edge of each of the first spacer element and the second spacer element.

19. The device of claim 17, wherein the ferroelectric insulator layer includes $HfZrO_2$, $HfAlO_2$, $PbZrTiO_3$ (or PZT), $SrTiO_3$, $BaTiO_3$, or combinations thereof.

20. The device of claim 17, wherein the high-k dielectric layer is $HfO_2$ and the ferroelectric insulator layer is $HfZrO_2$.

* * * * *